US00RE42199E

(19) United States
(12) Reissued Patent
Caldwell

(10) Patent Number: US RE42,199 E
(45) Date of Reissued Patent: Mar. 8, 2011

(54) INTEGRATED TOUCH SENSOR AND LIGHT APPARATUS

(75) Inventor: David W. Caldwell, Holland, MI (US)

(73) Assignee: TouchSensor Technologies, LLC, Wheaton, IL (US)

(21) Appl. No.: 12/199,539

(22) Filed: Aug. 27, 2008

Related U.S. Patent Documents

Reissue of:
(64) Patent No.: 7,098,414
Issued: Aug. 29, 2006
Appl. No.: 10/850,272
Filed: May 20, 2004

(51) Int. Cl.
*H01H 9/00* (2006.01)

(52) U.S. Cl. ..... 200/310; 200/317; 200/600; 200/5 A

(58) Field of Classification Search ..... 200/5 A, 200/600, 310–317; 341/22, 28, 33, 34; 345/168–170, 345/173, 176
See application file for complete search history.

(56) References Cited

U.S. PATENT DOCUMENTS

| | | | | | |
|---|---|---|---|---|---|
| 4,532,395 | A | * | 7/1985 | Zukowski | 200/314 |
| 4,855,550 | A | * | 8/1989 | Schultz, Jr. | 200/600 |
| 4,878,107 | A | * | 10/1989 | Hopper | 257/415 |
| 5,239,152 | A | * | 8/1993 | Caldwell et al. | 200/600 |
| 5,471,023 | A | * | 11/1995 | Kaizu et al. | 200/310 |
| 5,521,345 | A | * | 5/1996 | Wulc | 200/317 |
| 5,573,107 | A | * | 11/1996 | Nakano et al. | 200/314 |
| 5,594,222 | A | * | 1/1997 | Caldwell | 200/600 |
| 5,607,048 | A | * | 3/1997 | Kaizu et al. | 200/314 |
| 5,747,756 | A | * | 5/1998 | Boedecker | 200/5 A |
| 5,856,646 | A | * | 1/1999 | Simon | 200/600 |
| 5,900,599 | A | * | 5/1999 | Ohashi et al. | 200/5 A |
| 5,901,834 | A | * | 5/1999 | Inubushi et al. | 200/314 |
| 5,917,165 | A | * | 6/1999 | Platt et al. | 200/600 |
| 6,035,180 | A | * | 3/2000 | Kubes et al. | 455/575.1 |
| 6,100,478 | A | * | 8/2000 | LaPointe et al. | 200/314 |
| 6,234,651 | B1 | * | 5/2001 | Kodama et al. | 362/276 |
| 6,310,611 | B1 | * | 10/2001 | Caldwell | 345/173 |
| 6,320,282 | B1 | * | 11/2001 | Caldwell | 307/125 |
| 6,723,937 | B2 | * | 4/2004 | Englemann et al. | 200/600 |
| 6,944,018 | B2 | * | 9/2005 | Caldwell | 361/679.4 |
| 7,049,536 | B1 | * | 5/2006 | Marcus et al. | 200/310 |
| 7,186,936 | B2 | * | 3/2007 | Marcus et al. | 200/310 |
| 7,445,350 | B2 | * | 11/2008 | Konet et al. | 362/84 |
| 7,671,289 | B2 | * | 3/2010 | Matsukawa et al. | 200/313 |
| 2001/0020578 | A1 | | 9/2001 | Baier | |

FOREIGN PATENT DOCUMENTS

| | | |
|---|---|---|
| JP | 60162325 | 8/1985 |

(Continued)

OTHER PUBLICATIONS

Office Action issued in Canadian Application No. 2,467,820 dated Jun. 5, 2008.
Translation of Office Action issued in Japanese Application No. 2003–546482, Aug. 6, 2007.

(Continued)

*Primary Examiner*—Michael A Friedhofer
(74) *Attorney, Agent, or Firm*—Barnes & Thornburg LLP

(57) ABSTRACT

A touch sensor is physically integrated with a light emitting device to provide a switching device with built-in backlighting. In some embodiments, the touch sensor and the light emitting device share electrical components.

32 Claims, 37 Drawing Sheets

FOREIGN PATENT DOCUMENTS

| | | | |
|---|---|---|---|
| JP | 62143336 | | 3/1986 |
| JP | 62143336 X | * | 9/1987 |
| JP | 63501259 X | * | 5/1988 |
| JP | 1231232 A BS | | 9/1989 |
| JP | 1231232 X | | 9/1989 |
| JP | 1231232 | | 9/1989 |
| JP | 05-135654 BA | | 6/1993 |
| JP | 7073790 | | 3/1995 |
| JP | 7073790 A BS | | 3/1995 |
| JP | 7073790 X | * | 3/1995 |
| JP | 9139142 X | * | 5/1997 |
| JP | 9139142 | | 5/1997 |
| JP | 9139142 A BS | | 5/1997 |
| JP | 9306315 | | 11/1997 |
| JP | 9306315 A BS | | 11/1997 |
| JP | 9306315 X | | 11/1997 |
| JP | 10064386 X | * | 3/1998 |
| JP | 100064386 A BS | | 3/1998 |
| JP | 100064386 | | 3/1998 |
| JP | 11134987 X | * | 5/1999 |
| JP | 11134987 | | 5/1999 |
| JP | 11134987 A BS | | 5/1999 |
| JP | 11136116 A BS | | 5/1999 |
| JP | 11136116 | | 5/1999 |
| JP | 2000286690 A BS | | 10/2000 |
| JP | 2000286690 | | 10/2000 |
| JP | 2000286690 X | | 10/2000 |
| JP | 09-251820 BB | | 5/2002 |
| WO | 8702846 | | 5/1987 |
| WO | 8702846 A BS | | 5/1987 |

OTHER PUBLICATIONS

English translation of Japanese document No. 60162325.
Translation of extracts from Japanese utility March Application 61–31933 (JP–A–(U)–62–143336).
Translation of Office Action issued in Japanese Application No. 2003–546482, Sep. 18, 2008.
Communication from EPO dated Oct. 28, 2007.
IPER dated May 20, 2005.
Written Opinion dated Dec. 21, 2004.
Office Action issued Apr. 17, 2006 in corresponding Chinese Patent Application No. 02827331.1.
Office Action issued Oct. 22, 2007 in corresponding European Patent Application No. 02782318.6.
Office Action issued Nov. 9, 2010 in corresponding Japanese Patent Application No. 2008–030649 (2010).

* cited by examiner

FIG. 7A
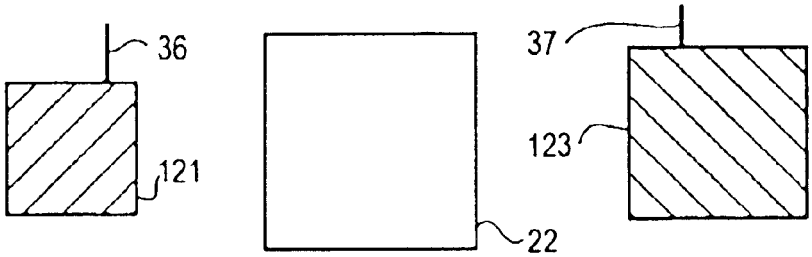
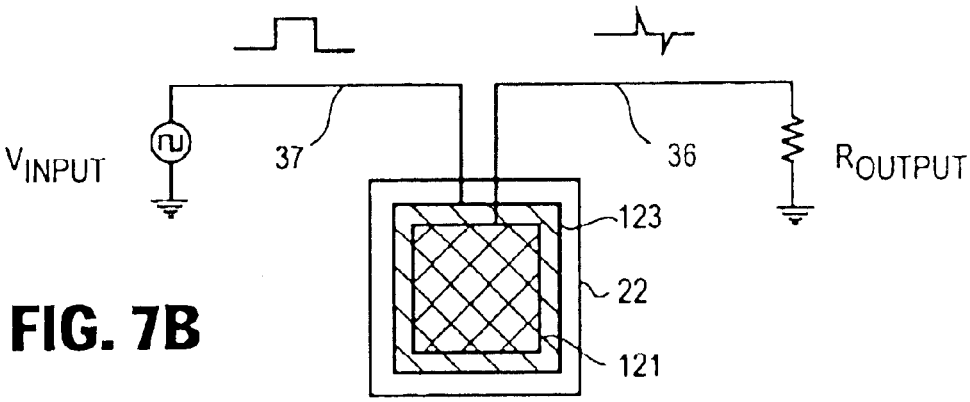
FIG. 7B
FIG. 7C
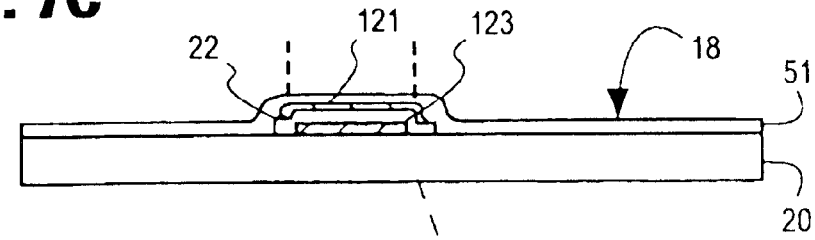
FIG. 7D
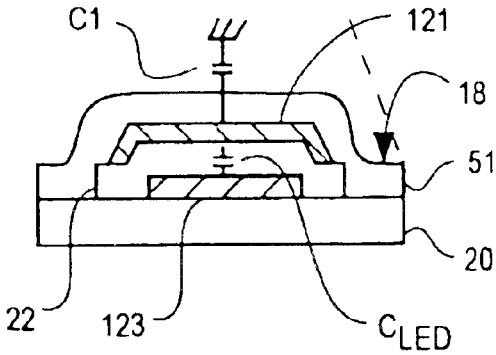

CHIP SELECT
TOUCH RETURN
LED SELECT
T0
T1
T2
T3
T4
T5
T6
LED SELECT
M12
$R_{LED2}$
$R_{OUTPUT}$
32
41
40
D1
VSS
NO TOUCH
TOUCH RETURN
TOUCH
$V_{SUPPLY}$
VDD
M19
POS
NEG
M15
M14
VSS
M18
ROUTER
M21
M20
VDD
M17
M16
OSC
CHIP SELECT
M13
$C_{BLOCK}$
$R_{INNER}$
$R_{LED1}$
$V_{INPUT}$
33
$C_{OUTER}$
$C_{INNER}$
121
LED
23

INTEGRATED TOUCH SENSOR AND LIGHT APPARATUS

Matter enclosed in heavy brackets [ ] appears in the original patent but forms no part of this reissue specification; matter printed in italics indicates the additions made by reissue.

CROSS-REFERENCE TO RELATED APPLICATIONS

This application claims priority from *U.S. patent application Ser. No. 10/271,438, filed on Oct. 15, 2002, which claims priority from* U.S. Provisional Patent [Applications Ser.] *Application* No. 60/334,040, filed on Nov. 20, 2001, and *U.S. Provisional Patent Application* No. 60/341,350, filed on Dec. 18, 2001. The disclosures of the foregoing references are hereby incorporated herein by reference.

BACKGROUND OF THE INVENTION

Touch sensors are solid state switches that respond to a user's touch or encroachment. As such, they often can be used in place of conventional mechanical switches. Known touch sensors typically include a touch pad having one or more electrodes and an associated circuit that induces an electric field about the touch pad and responds to changes in the electric field when the electric field is disturbed by a stimulus such as a user's touch or proximity. The touch pad and associated circuit typically are disposed on a substrate such as a printed wiring board or a piece of glass. A portion of this or another related substrate typically defines an operative touch surface which the user must touch or approach to provide the stimulus required to trigger the touch sensor. The control circuit can be configured to control a device such as a light, motor or other device.

Several types of touch sensors are known in the art, including capacitive touch sensors, infrared touch sensors, electric field touch sensors, acoustic touch sensors and electromagnetic touch sensors. Such touch sensors can be configured as described in U.S. Pat. No. 5,594,222, No. 5,856,646, No. 6,310,611, and No. 6,320,282 and in many other ways.

Touch sensors can be used as part of an input/output system where some form of aural or visual feedback is provided. Feedback can involve either alerting the user to the presence of an operative touch surface or informing the user that a touch has triggered a response in the touch sensor. In many cases, visual feedback involves back-lighting the operative touch surface or other areas on an interface panel. Backlighting can be provided by a light emitting diode (LED) or a light emitting polymer (LEP), including an organic light emitting diode (OLED) or a polymer light emitting diode (PLED) (both of which are LEPs), or any other suitable light source.

LED, OLED and PLED devices convert electrical energy to light energy in the form of photons. These light emitting devices can include either a transparent anode or a transparent cathode through which the photons generated at their light emitting layers can pass. The light emitting layers of LEDs include semiconductors with doped physical lattice crystal structures. The light emitting layers of OLEDs and PLEDs are composed of small organic molecules and relatively larger organic molecules, respectively. All of the foregoing light emitting devices are typically very thin and can be constructed into point sources or can be made to illuminate large areas, but it may be more economical to do so with OLEDs and PLEDs than with semiconductor devices like LEDs. Using thermal evaporator, thin film sputtering or spin coating techniques, both OLEDs and PLEDs can be mass produced in fewer steps than can semiconductors and may also be economically produced using micro-deposition or ink jet and spin coating equipment. Light produced by any light source can also be spread out or diffused using lenses, light pipes and other suitable devices.

Because backlighting can be advantageously aligned with an operative touch surface, it is sometimes desirable to locate a touch sensor in close proximity to and/or atop a light emitting device. In the latter case, the touch sensor's electrodes preferably are transparent to allow the light produced by the light emitting device to reach the user. In the prior art, these electrodes are separate components of the backlit touch sensor. Because the touch sensor and backlighting device are separate components, the electrical addressing required to drive them both is often complicated and costly. In cases where the touch sensor must overlie the light emitting device, the light from the light emitting device can be attenuated by the transparent layers of an OLED or PLED and further by the touch sensor components before it reaches the user. In all cases, aligning a light emitting device with a separately constructed touch sensor involves extra material and other manufacturing costs owing to the required connections and alignment of the two.

SUMMARY OF THE INVENTION

The present invention relates to integration of touch sensors with light emitting devices. One embodiment of the invention involves touch sensors having one or more electrodes that also serve as a conducting layer of a light emitting device. Another embodiment of the invention involves various touch sensor configurations wherein a touch sensor physically overlies but is electrically separate from a light emitting device. The invention further relates to electrical drive and control circuits for operating such devices. The various embodiments of the present invention described below can greatly reduce the cost and complexity of using backlighting with touch sensors. For instance, the present invention can reduce or eliminate the extra material and manufacturing cost associated with the separate touch sensor and lighting assemblies known in the art, which must be electrically coupled and aligned.

BRIEF DESCRIPTION OF THE DRAWINGS

FIGS. 7A–7D illustrate the separate layers and construction of a top-emitting integrated light emitting capacitive touch sensor wherein the electrodes of the touch sensor are conducting layers of the light emitting device;

FIG. 11A illustrates the stimulation of the electrode of the touch switch assembly through the relatively large coupling capacitance of the light emitting device;

FIG. 11B illustrates the direct stimulation of the electrode of the touch switch assembly;

(FIG. 15A illustrates the stimulation of the touch switch assembly electrode through the relatively large coupling capacitance of the light emitting device, and FIG. 15B illustrates the direct stimulation of the electrode of the touch switch assembly);

DETAILED DESCRIPTION OF THE DRAWINGS

While the drawings generally depict capacitive and electric field touch switches for the purpose of illustration, the principles of the present invention can be seen by those skilled in the art as appropriate for any manner of touch switch device, including, but not limited to, capacitive touch switches, infrared touch switches, electric field touch switches, acoustic touch switches and electromagnetic touch switches. Specific examples include the touch switches described in U.S. Pat. No. 5,594,222, No. 5,856,646, No. 6,310,611 and No. 6,320,282, each naming David W. Caldwell as inventor. The disclosures of the foregoing U.S. Patents are hereby incorporated herein by reference. The disclosures of U.S. patent applications Ser. No. 10/271,933, entitled Intelligent Shelving System, Ser. No. 10/272,219, entitled Molded/Integrated Touch Switch/Control Panel Assembly and Method for Making Same, Ser. No. 10/272,377, entitled Touch Switch with Integral Control Circuit, and Ser. No. 10/272,047, entitled Touch Sensor with Integrated Decoration, all filed on Oct. 15, 2002 and all naming David W. Caldwell as an inventor, are also hereby incorporated herein by reference.

Figure 1A:
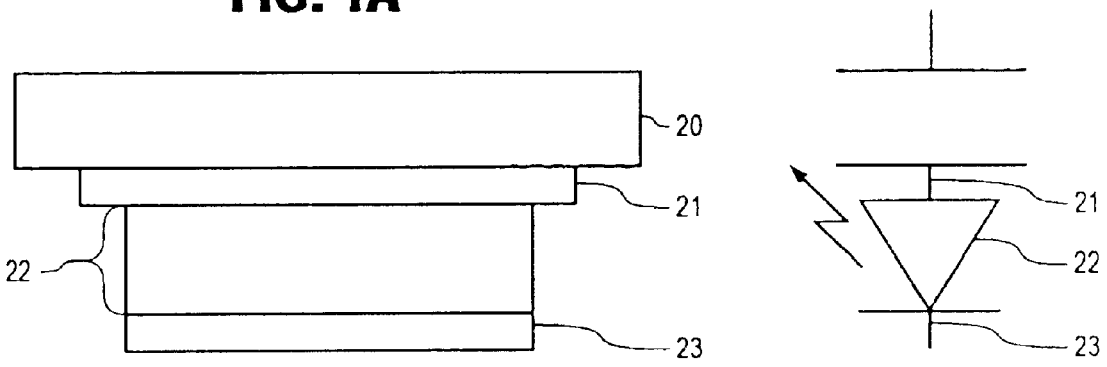
FIGS. 1A–1C illustrate typical cross-sectional configurations of an LED, OLED and PLED, respectively, each of which can act as a touch sensor when configured according to the present invention.
Figure 1B:
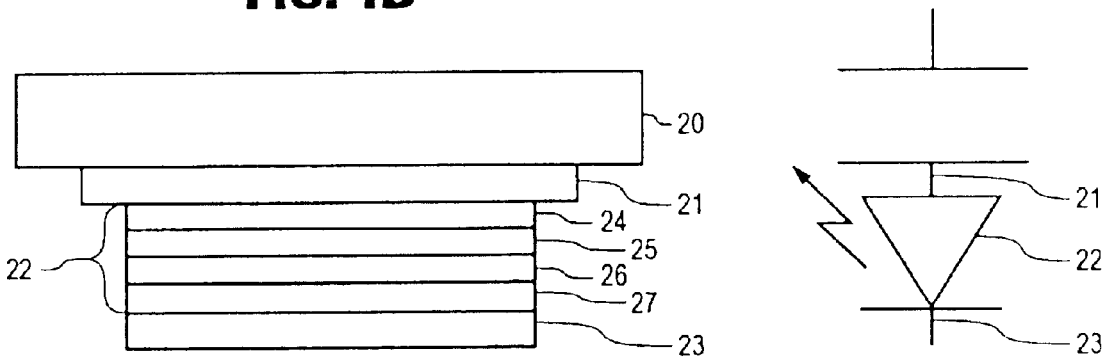
Figure 1C:
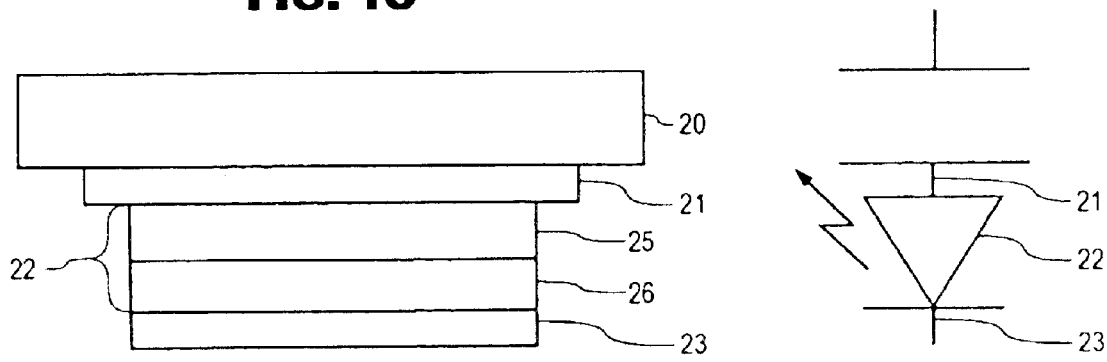

FIGS. 1A–1C illustrate the separate layers that make up typical light emitting devices. The light emitting devices illustrated in FIGS. 1A–1C are bottom-emitting light emitting devices, as would be evident to one skilled in the art, but could also represent top-emitting light emitting devices. The separate layers of each light emitting device shown in FIGS. 1A–1C can be disposed on substrate 20 using the techniques discussed above or any other suitable techniques known in the art. The separate layers of each light emitting device include anode 21, emissive stack 22 and cathode 23. In FIGS. 1A–1C, anode 21 is typically transparent and can be composed of indium tin oxide or other transparent electrode material. The composition of emissive stack 22 is slightly different for each device. Thus, in FIG. 1A, emissive junction layer 22 of the LED depicted can be a standard PN junction material, e.g., InGaN, GaP, AlInGaP, or GaAlAs. In FIG. 1B, emissive stack 22 of the OLED depicted can include hole injection layer 24, hole transport layer 25, emitting layer 26, which can be, for example, CuPc, NPB, and Alq3, respectively, and electron transport layer 27. In FIG. 1C, emissive stack of the PLED depicted can include a hole transport layer 25 and emissive layer 26, which can be PEDOT and PPV, respectively. One difference between the composition of emissive stacks 22 of the OLED of FIG. 1B and of the PLED of FIG. 1C is the relatively larger polymer molecules (not shown) in the latter. The configuration of the OLED of FIG. 1B provides for an efficient LEP, but other, less efficient, configurations can be used in any of the embodiments of the present invention described below. For instance, LEPs can include as few as one organic layer. The multiple layered configuration of the OLED (or PLED) depicted in FIG. 1B can vary depending on the application. Emissive stack 22 of FIGS. 1B and 1C can include HTL, ETL, other emissive organic molecules or composite materials. When these light emitting devices are configured according to certain embodiments of the present invention described below, they can exhibit a touch sensor field and can act as a touch switch when coupled to a control circuit. Each of these devices are compatible with the various embodiments described below. Where one device is used to illustrate an particular embodiment, it will be understood that other light emitting devices could be substituted.

Figure 2A:
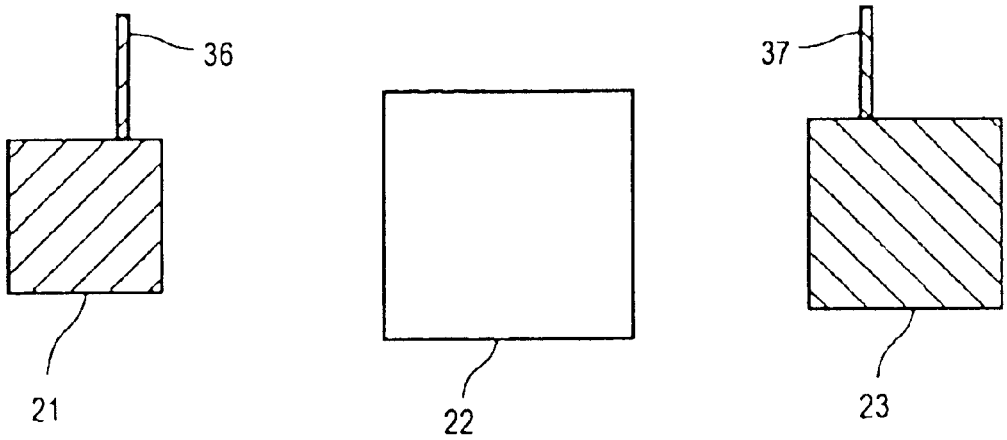
FIGS. 2A–2C illustrate the separate layers and construction of an OLED or PLED that can act as a touch sensor.
Figure 2B:
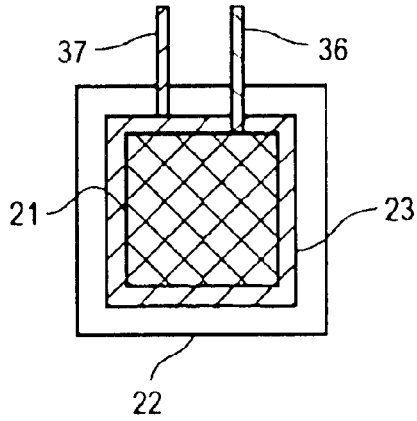
Figure 2C:
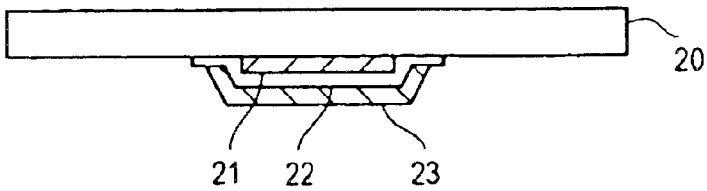

FIGS. 2A–2C illustrate the separate layers and basic construction of a typical bottom-emitting PLED or OLED. FIG. 2A shows the anode 21, emissive stack 22 and cathode 23 of a PLED or OLED. Both anode 21 and cathode 23 include a trace, 36 and 37, respectively, that allows the PLED or OLED to be connected to a voltage source (not shown). FIG. 2B shows a bottom view of the assembled PLED or OLED, with anode 21 beneath emissive stack 22, which is beneath cathode 23. FIG. 2C shows the assembled PLED or OLED borne on substrate 20. Anode 21 can advantageously be transparent to allow light from emissive stack 22 to reach the surface of substrate 20. Other configurations of anode 21 can include a fine mesh or other configuration that, while not transparent, allows at least a portion of light from emissive stack 22 to reach the surface of substrate 20. In any of the configurations described herein, at least a portion of substrate 20 must be transparent or translucent if light is to pass therethrough.

Figure 3A:
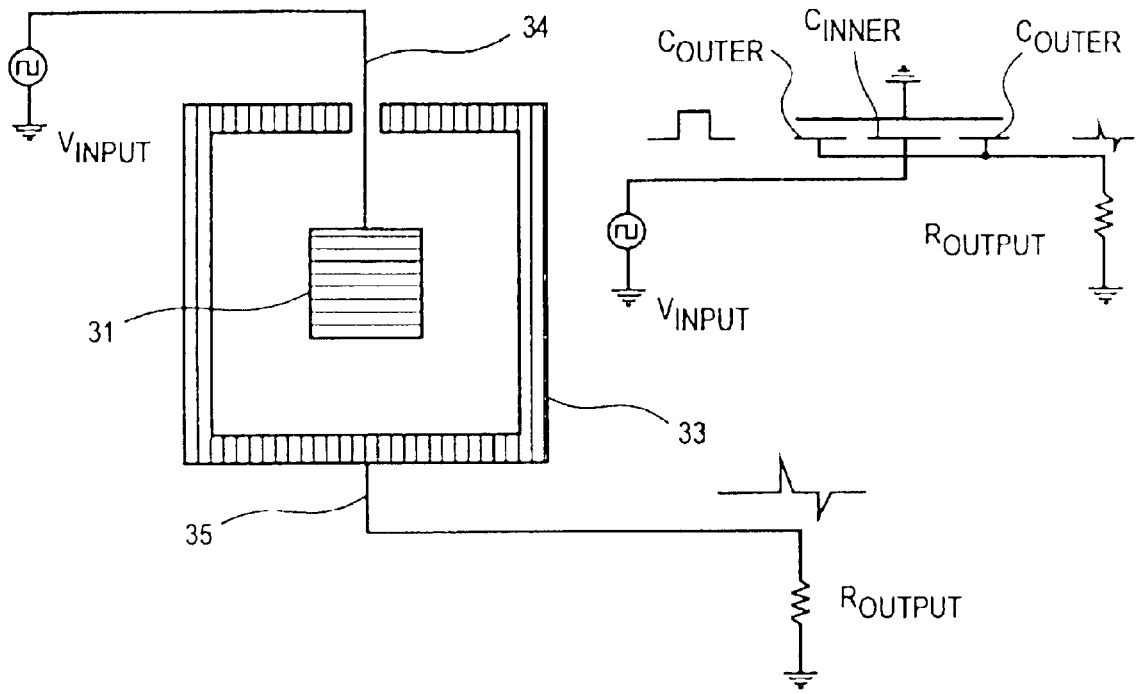
FIGS. 3A–3B illustrate the basic construction of a capacitive touch sensor.
Figure 3B:
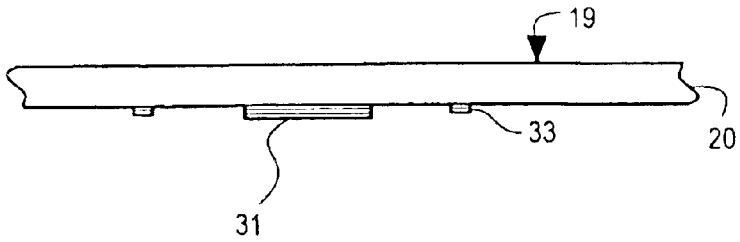

FIGS. 3A–3B illustrate a capacitive touch sensor. FIG. 3A shows electrode 31 connected through trace 34 to square wave voltage source $V_{input}$ (in other embodiments, other voltage sources and waveforms may be used) and electrode 33, substantially surrounding electrode 31, connected through trace 35 to resistance $R_{ouput}$. Voltage source $V_{input}$ induces an electric field between and about electrode 31 and electrode 33. FIG. 3B shows a cross-sectional view of the capacitive touch sensor of FIG. 3A borne on substrate 20. Surface 19 of substrate 20 prevent a user from directly touching or coming more than a minimum distance near electrodes 31 and 33. This creates capacitance $C_{inner}$ and capacitance $C_{outer}$ between a user's appendage and electrodes 31 and 33, respectively, as shown in FIG. 3A. A user's approach toward or touch of surface 19 of substrate 20 can increase the capacitance between electrode 33 and the user's approaching or touching appendage. The increased capacitance increases the voltage at electrode 33. This increased voltage can induce a signal in a control circuit (not shown) to effect a response in an end device (not shown).

Other touch sensor configurations are also possible. Electrode 33 could receive the signal of voltage source $V_{input}$ and electrode 31 could send an output signal to a control circuit or a single electrode could both receive an input signal and send an output signal. A third electrode (not shown) can also be included in the touch sensor of FIGS. 3A–3B, preferably between electrode 31 and electrode 33. This third electrode could be connected to the signal of square wave voltage source $V_{input}$. Electrodes 31 and 33 could then both be connected to a differential control circuit, which then could advantageously be configured to differentiate between the voltages induced in electrodes 31 and 33. For instance, a relatively large voltage induced in electrode 31 can cause the control circuit to generate an output to effect a response in an end device, while a relatively large voltage induced in electrode 33, or a comparable voltage induced in both electrodes 31 and 33, can cause the control circuit to generate no output or a different output so as to effect no response in an end device.

Figure 3C:
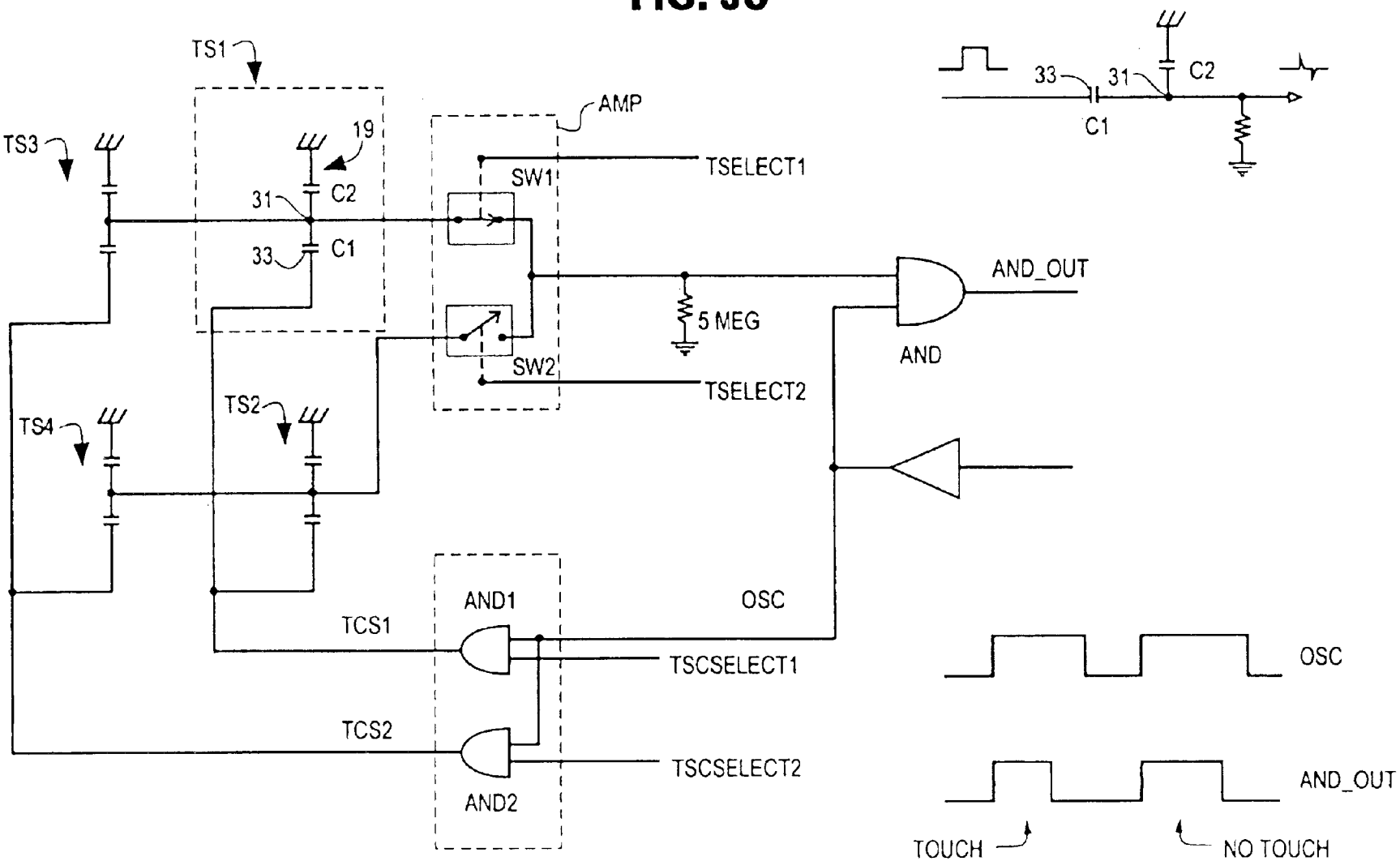
FIG. 3C illustrates a schematic representation of a drive circuit for a two-by-two matrix of touch sensors.

Touch sensors can be located on an input/output interface panel in a matrix pattern. FIG. 3C illustrates schematically a drive circuit capable of selectively activating the touch sensors of FIGS. 3A–3B arranged in a two-by-two matrix. Touch sensors TS1–TS4 are shown schematically. Each touch sensor involves a capacitance C1 between electrode 31 and electrode 33 and a capacitance $C_{LED}$ between electrode 33 and surface 19 of substrate 20. When a user of the interface panel of touch sensors touches or approaches the surface 19 of substrate 20, the capacitance between electrode 33 and surface 19 and the voltage of electrode 33 can increase. The touch induced voltage increase of electrode 33 prolongs the peak detected by AND gate AND as shown relative to input OSC in FIG. 3C. The change in voltage can be sent to an output gate, a control circuit or, ultimately, to an end device.

The logic gates of the drive circuit of FIG. 3C can control the activation of the touch sensors of the matrix. In FIG. 3C, oscillating signal OSC sends a square wave signal to AND gates AND1 and AND2, which also receive inputs from signals TSCSELECT1 and TSCSELECT2, provided by a logic circuit (not shown). When both oscillating signal OSC and signal TSCSELECT1 are high, AND gate AND1 will have a high output TSC1, which will induce an electric field in touch sensors TS1 and TS2. Signal TSCSELECT1 thus works to control the passage of oscillating signal OSC to the touch sensors of the right hand column of touch sensors, composed of touch sensors TS1 and TS2. The analog multiplexer AMP of FIG. 3C can select which of the touch sensors TS1 and TS2 will be allowed to send a response signal to AND gate AND. When TSELECT1, according to a logic circuit (not shown), sends a signal to switch SW1 that closes it, and TSELECT2 does not send a similar signal to switch SW2, AND gate AND can output a signal on trace AND_OUT that is dependent on the voltage of TS1. When either TSELECT1 or TSELECT2 send a signal to switch SW1 or SW2, respectively, closing either switches, AND gate AND can output a signal on trace AND_OUT that is dependent on the voltage of either touch sensor TS1 or TS2. Thus, the drive circuit of FIG. 3C is capable of activating an individual touch sensor within the matrix, a column of touch sensors within the matrix or a row of touch sensors within the matrix, preferably according to a logic circuit (not shown).

Figure 4A:
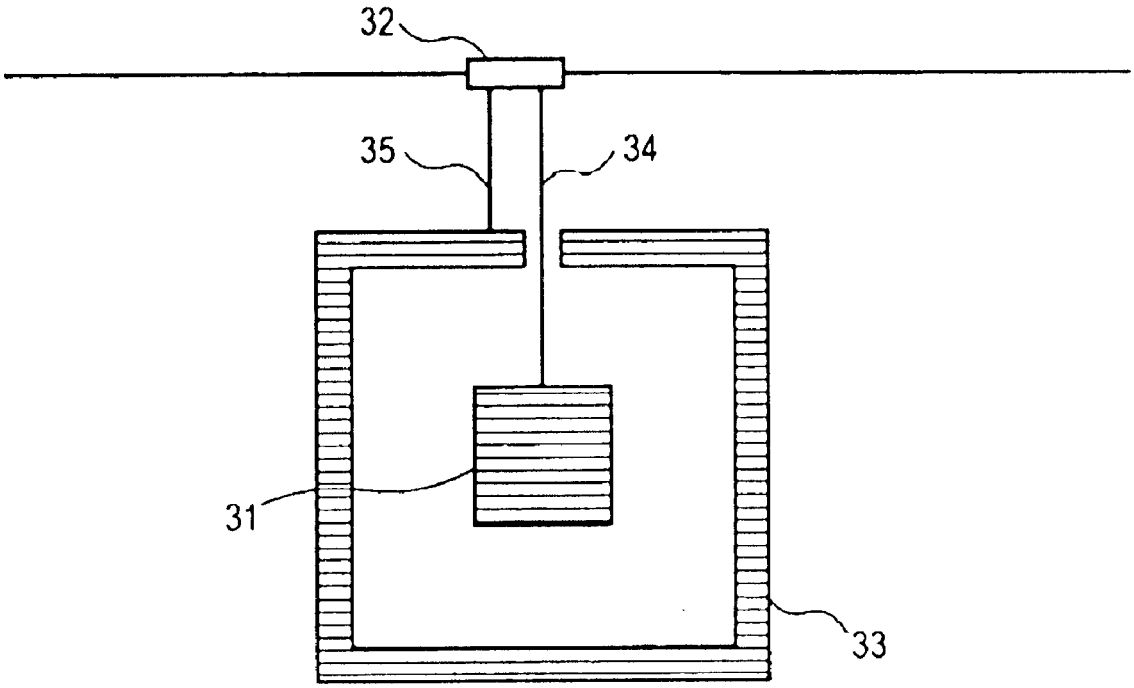
FIGS. 4A–4B illustrate the basic construction of a touch switch assembly including a typical touch switch with an integrated control circuit in close proximity to the touch sensor.
Figure 4B:
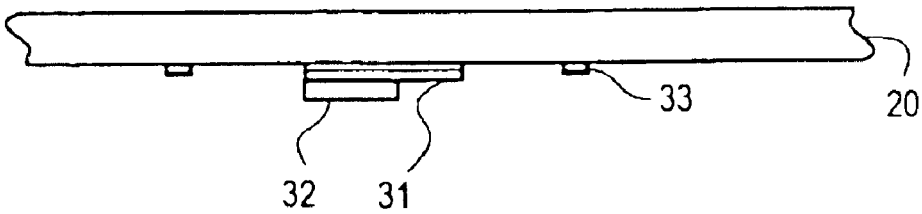
Figure 4C:
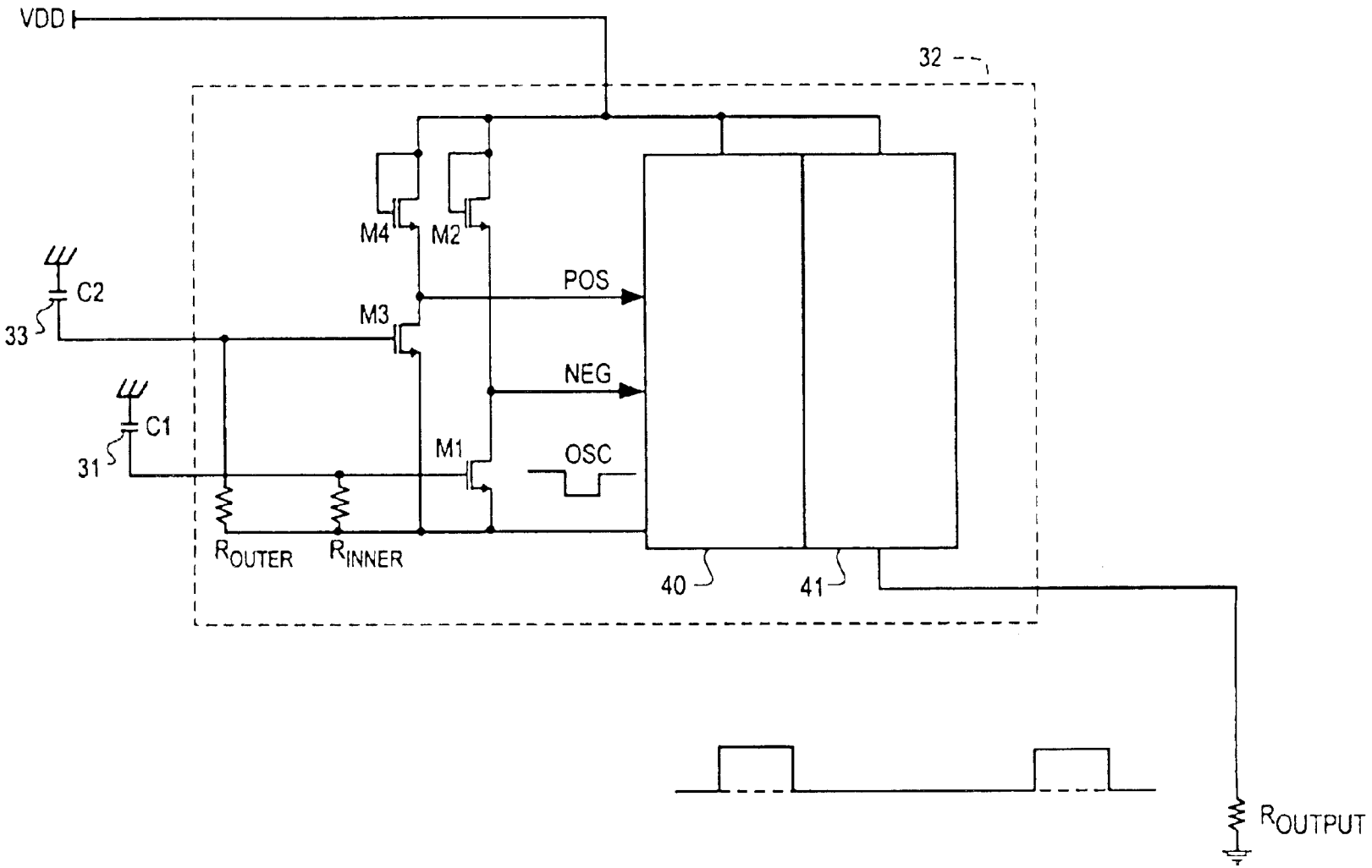
FIG. 4C illustrates a schematic representation of the integrated control circuit of FIGS. 4A–4B including the input stage and block diagrams of the processing and latch circuits.

FIGS. 4A–4B illustrate a touch switch with integrated control circuit, wherein integrated control circuit 32 is located proximate touch sensor electrodes 31 and 33, which are connected to integrated control circuit 32 through traces 34 and 35, respectively. In FIG. 4B, the touch switch with integrated control circuit of FIG. 4A is shown, in cross-section, borne on substrate 20. FIG. 4C illustrates a possible configuration of integrated control circuit 32 of FIGS. 4A–4B. In FIG. 4C, oscillating signal OSC stimulates both electrode 31 and 33 through resistances $R_{inner}$ and $R_{outer}$, respectively. Active devices M2 and M4 are connected to chip select signal VDD. Though NMOS active devices are shown, other devices could be substituted, including PMOS or bipolar active devices or resistors. The gates of active devices M1 and M3 are connected to electrodes 31 and 33, respectively. Though NMOS devices are shown, other types of active devices could be substituted including PMOS or bipolar active devices. The components of integrated control circuit 32 and electrodes 31 and 33 can be configured so that peak potentials developed at inputs POS and NEG can be substantially equal when no stimulus is applied to either electrode. Alternatively, the neutral state peak potential at input NEG can be relatively higher than at input POS to prevent unintended actuations of the processing and latch circuits 40 and 41, respectively. When a user-induced stimulus is applied at electrode 31, electric field capacitance C1 increases and the potential at electrode 31 increases. The potential at the gate of active device M1 will then temporarily be greater than the potential at its source, causing active device M1 to be biased on. When biased on, active device M1 will have a drain current that can be converted to a proportional potential by active device M2, causing the differential between the potential at inputs POS and NEG to change, in turn causing processor circuit 40 to close latch circuit 41 allowing current to develop across resistor $R_{output}$. The operation of one embodiment of processing circuit 40 and latch circuit 41 is more thoroughly described in U.S. Pat. No. 6,320,282. Other processing outputs and latch circuits could be used as well.

Figure 5A:
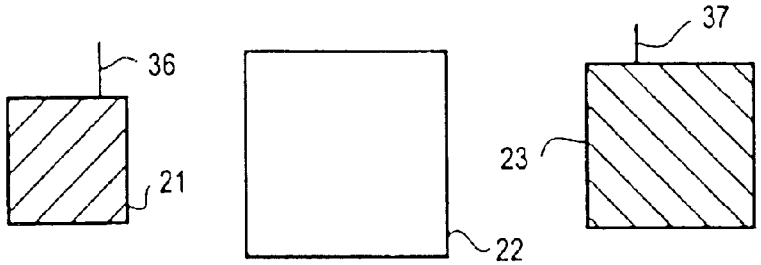
FIGS. 5A–5D illustrate the separate layers and construction of the capacitive touch sensor of FIGS. 3A–3B integrated with an OLED or PLED backlighting device.
Figure 5D:
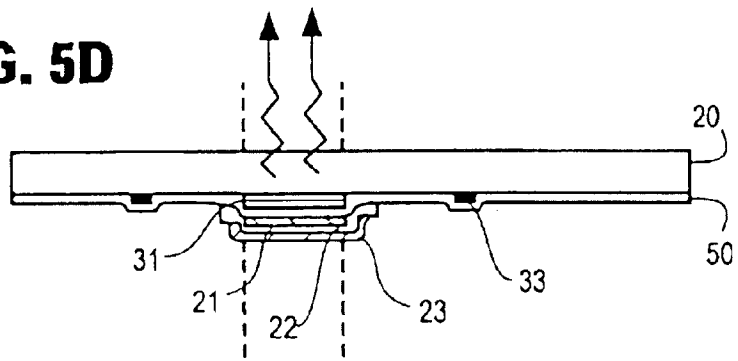
Figure 5B:
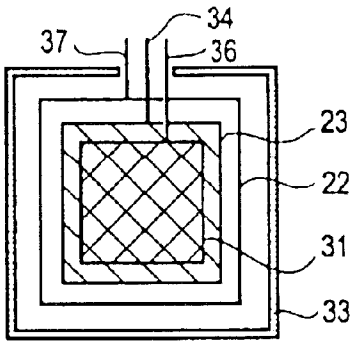
Figure 5C:
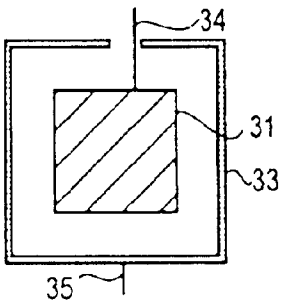

FIGS. 5A–5D illustrate a light emitting touch switch according to the present invention including the capacitive touch sensor of FIGS. 3A–3B and the light emitting device of FIGS. 2A–2C. The embodiment of the present invention depicted in FIGS. 5A–5D involves a touch switch and a light emitting device that are physically integrated but electrically separate. FIG. 5A shows the separate layers of the light emitting device, including anode 21, trace 36 connected to anode 21, emissive stack 22, cathode 23 and trace 37 connected to cathode 23. FIG. 5C shows the touch sensor including electrode 31, trace 34 connected to electrode 31, electrode 33, and trace 35 connected to electrode 33. Traces 34 and 35 could function as an output line, could be connected to a signal source or both. FIG. 5B shows the separate layers of the light emitting touch switch according to the present invention one atop the other, with the touch switch components of FIG. 5C, namely, electrodes 31 and 33 atop anode 21 atop emissive stack 22 atop cathode 23. In FIG. 5B, electrode 31 is aligned with and overlies anode 21, which is consequently not labeled. FIG. 5D shows the light emitting touch switch according to the present invention borne on substrate 20. Insulating layer 50 separates the touch sensor components of FIG. 5C from the light emitting device components of FIG. 5A. Insulating layer 50 can be $SiO_2$ or any other suitable material and is preferably entirely transparent or transparent in certain areas, but may also be non-transparent. Anode 21 of the light emitting device is preferably transparent to allow light from emissive stack 22 to reach surface 19 of substrate 20, but can be otherwise, as discussed above. As indicated previously, at least a portion of substrate 20 must be transparent or translucent to allow light to pass therethrough to surface 19 thereof.

Figure 5E:
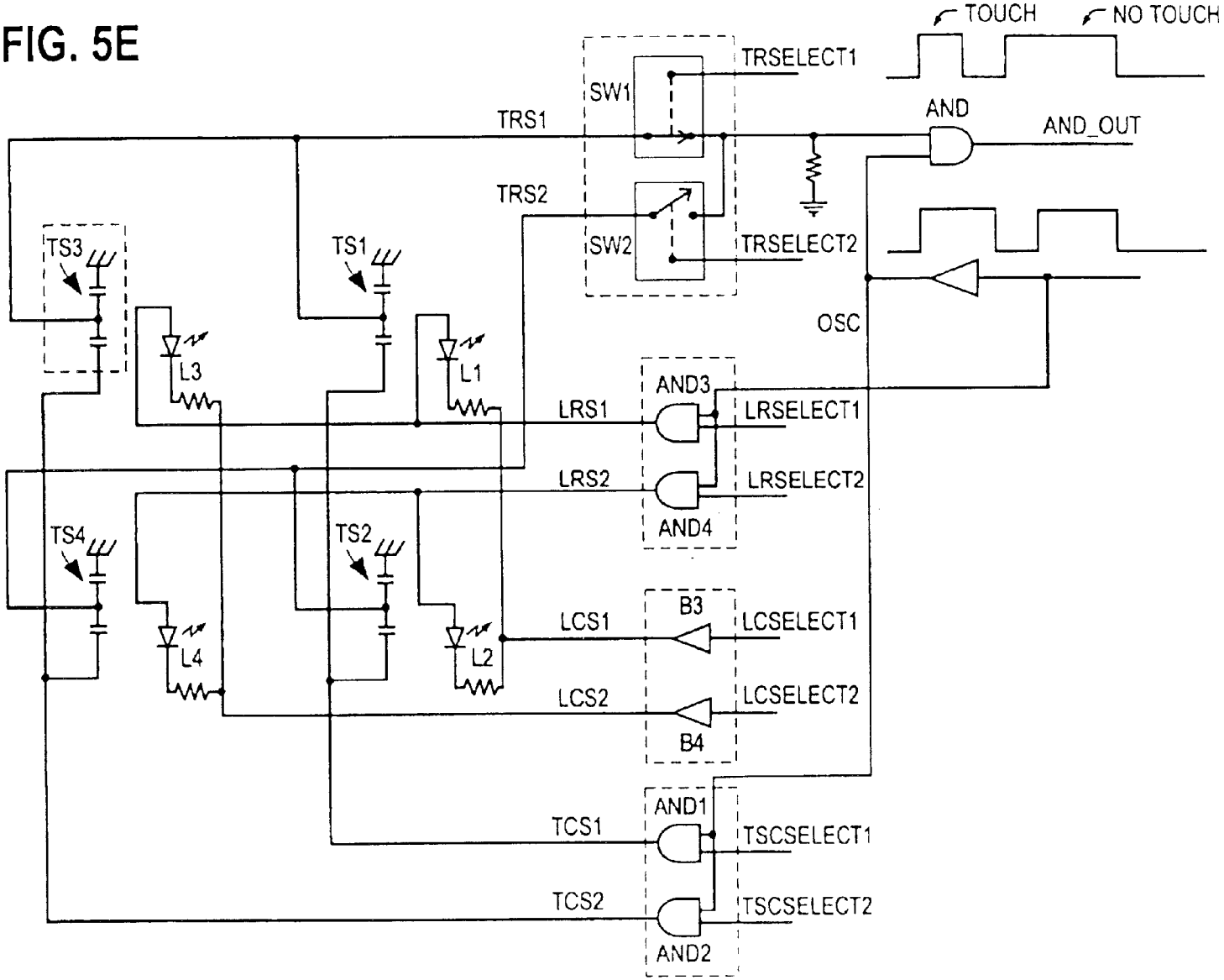
FIG. 5E illustrates a schematic representation of a drive circuit for separately stimulating a two-by-two matrix of the integrated touch sensors and light emitting devices of FIGS. 5A–5D.

FIG. 5E illustrates a possible drive circuit capable of controlling the activation of a two-by-two matrix of the physically integrated but electrically separate touch sensors and light emitting devices of FIGS. 5A–5B. In FIG. 5E, the activation of individual touch sensors TS1–TS4 or columns of touch sensors is as discussed with reference to FIG. 3C, except that either electrode 31 or 33 of each of touch sensors TS1–TS4 could be directly connected to input signals TSCSELECT1 or TSCSELECT2 and the other electrode 31 or 33 of each of touch sensors TS1–TS4 could be connected to AND gate AND through corresponding switch SW1 or SW2 of analog multiplexer AMP. The activation of light emitting devices L1–L4 can be independent of the activation of touch sensors TS1–TS4 or else can be synchronized, or dependent on the activation of touch sensors TS1–TS4. For instance, a logic circuit (not shown) could activate the light emitting device or devices underneath an activated (i.e., ready for use) individual touch sensor or group of touch sensors. Alternatively, a logic circuit (not shown) could activate the light emitting device or devices underneath an activated and touch stimulated touch sensor or group of touch sensors. Other logic schemes also are possible. The activation of light emitting devices L1–L4 can be controlled by input signals LCSELECT1 and LCSELECT2 and LRSELECT1 and LRSELECT2 through AND gates AND3 and AND4. For instance, light emitting device L1 will be on, emitting light, when the output LRS1 of AND gate AND3 is high and input LCSELECT1 is low. In this state, current will flow through light emitting device L1, causing it to emit light. The drive circuit of FIG. 5E will be understood to be capable of activating either individual light emitting devices or columns or rows of light emitting devices.

Figures 5F, 5G:
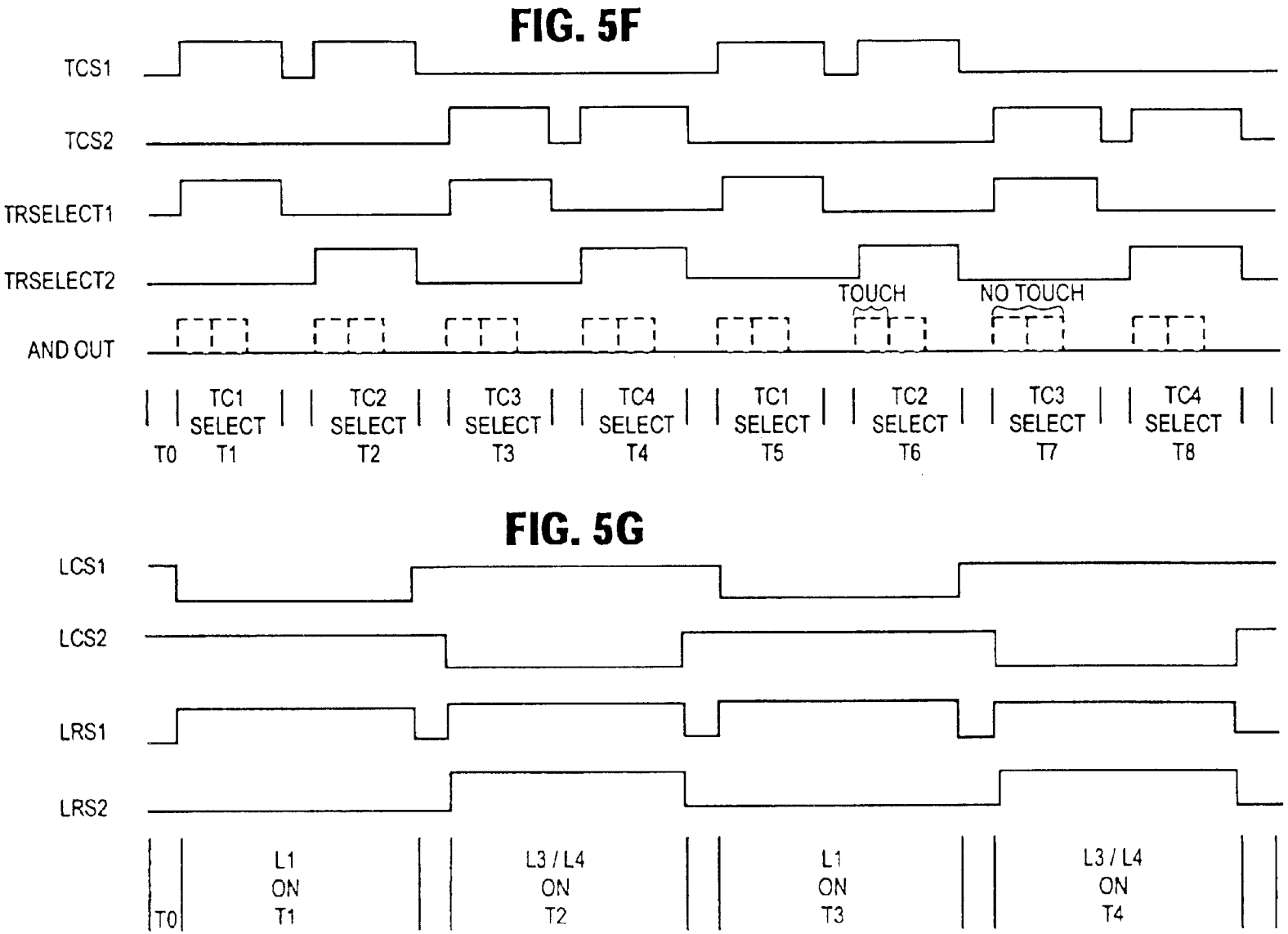
FIGS. 5F–5G are timing diagrams for the drive circuit of FIG. 5E.

FIGS. 5F–5G are timing diagrams of the drive circuit of FIG. 5E, wherein the timing of the activation of both the touch sensor and light emitting devices are shown. In FIG. 5F, the timing of the drive circuit is as described above with respect to FIG. 3C. FIG. 5F further shows how output AND_OUT of AND gate AND responds to a user's touch. For instance, at times T1 and T5, touch sensor TS1 is activated and the input 61 of AND gate AND can correspond to the potential at either electrode 31 or 33 of touch sensor TS1. When touch stimulated, output AND_OUT is high for a shorter interval during time T1 than when not stimulated. The activation and stimulation of touch sensors T3–T4 is similar to that of touch sensor T1. Also, though not shown in FIG. 5F, a row or column of touch sensors can be activated simultaneously, just as can an individual touch sensor, as can be understood from the description of the drive circuit of FIG. 5E.

In FIG. 5G, when inputs LRSELECT1 and OSC are high, the output LRS1 of AND gate AND3 will be high. When input LCSELECT1 is low, output LCS1 of buffer B3 will be low. Thus, when inputs LRSELECT1 and LCSELECT1 are high, LRS1 will be high and LCS1 will be low, causing current to flow through light emitting device L1, which will be on and emit light, as shown at times T1 and T3 of FIG. 5F.

The drive circuit of FIG. 5E is also capable of activating a column or row of light emitting devices. Thus, at times T2 and T4, inputs LRSELECT1, LRSELECT2 and OSC are high, making outputs LRS1 and LRS2 high as well, and input LCSELECT2 is high, making output LCS2 of buffer B4 low. The condition of the drive circuit at times T2 and T4 will cause current to flow through light emitting devices L3 and L4, causing them to emit light. Activation of a row of light emitting devices is not shown in FIG. 5G but will be understood from the description of the drive circuit of FIG. 5E.

Figure 6A:
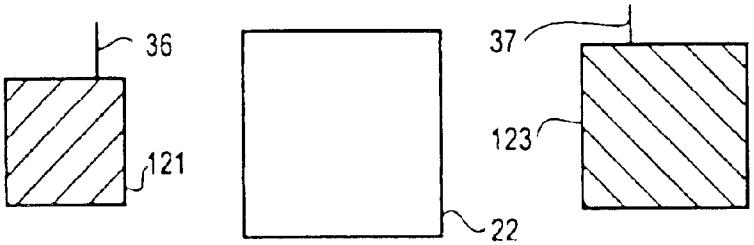
FIGS. 6A–6E illustrate the separate layers and construction of a bottom-emitting integrated light emitting capacitive touch sensor wherein the electrodes of the touch sensor are conducting layers of the light emitting device.
Figure 6B:
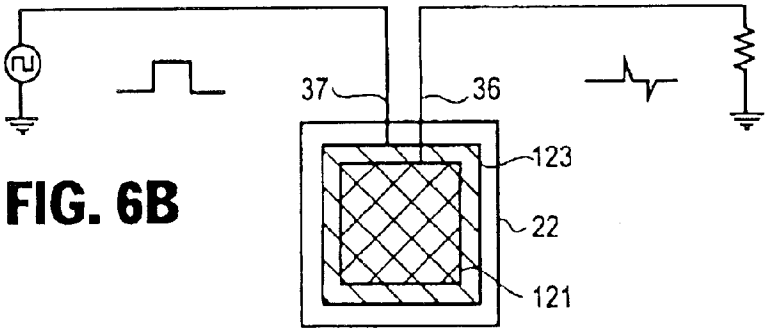
Figure 6C:
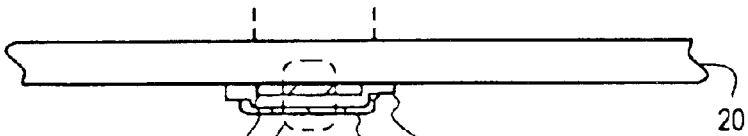

FIGS. 6A–7D illustrate an integrated light emitting touch sensor wherein the conductive layers of the light emitting device, namely anode 121 and cathode 123, also function as electrodes of the touch sensor. FIGS. 6A–6E illustrate a bottom-emitting integrated light emitting touch sensor. FIGS. 7A–7D illustrate a top-emitting integrated light emitting touch sensor. FIGS. 6A and 7A show the separate layers of the integrated light emitting touch sensor, including anode 121, emissive stack 22 and cathode 123. Traces 36 and 37 are connected to anode 121 and cathode 123, respectively. FIGS. 6B and 7B show how voltage source stimulus $V_{input}$ can be connected through trace 37 to cathode 123 and how trace 36 can be a return line including resistor $R_{output}$. The layers of the integrated light emitting touch sensor are shown so that, in FIGS. 6B and 6C, anode 121 overlies emissive stack 22, which overlies cathode 123, whereas, in FIGS. 7B and 7C, cathode 123 overlies emissive stack 22, which overlies anode 121. FIGS. 6C and 7C show how the integrated light emitting touch sensors of FIGS. 6B and 7B, respectively, can be borne on substrate 20.

Figure 6D:
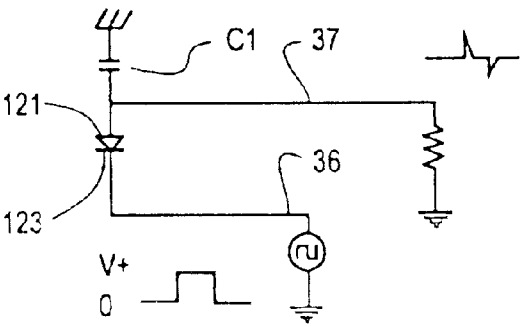
Figure 6E:
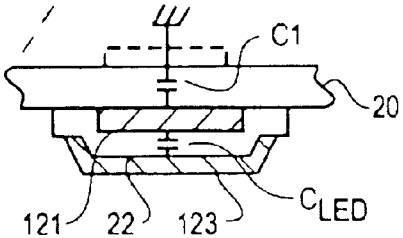

In FIG. 7C, decorative layer 51 overlies the integrated light emitting touch sensor of FIG. 7B. As shown in FIG. 7D, decorative layer 51 can provide the capacitance C1 between anode 21 and surface 18 of decorative layer 51, that might otherwise be provided by substrate 20, as shown in FIG. 6E. The capacitance C1 of FIG. 7D could also be provided by a second substrate (not shown) overlying the integrated light emitting touch sensor. In both FIGS. 6E and 7D, capacitance $C_{LED}$ exists between anode 121 and cathode 123. FIG. 6D shows a schematic representation of the integrated light emitting touch sensors of FIG. 6B.

Figure 8A:
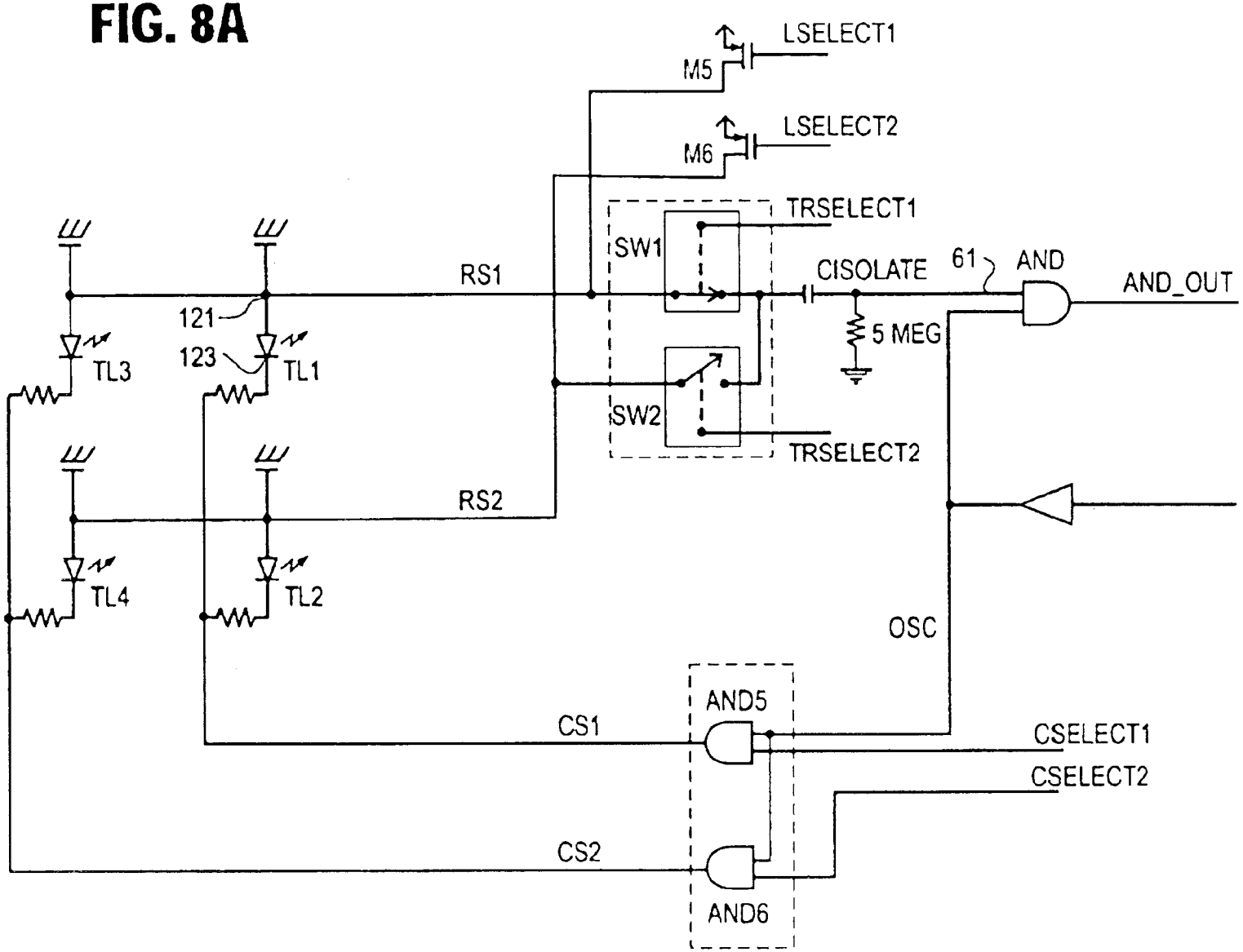
FIG. 8A illustrates a schematic of a drive circuit for a two-by-two matrix of the integrated light emitting touch sensors of FIGS. 6A–7D.
Figure 8B:
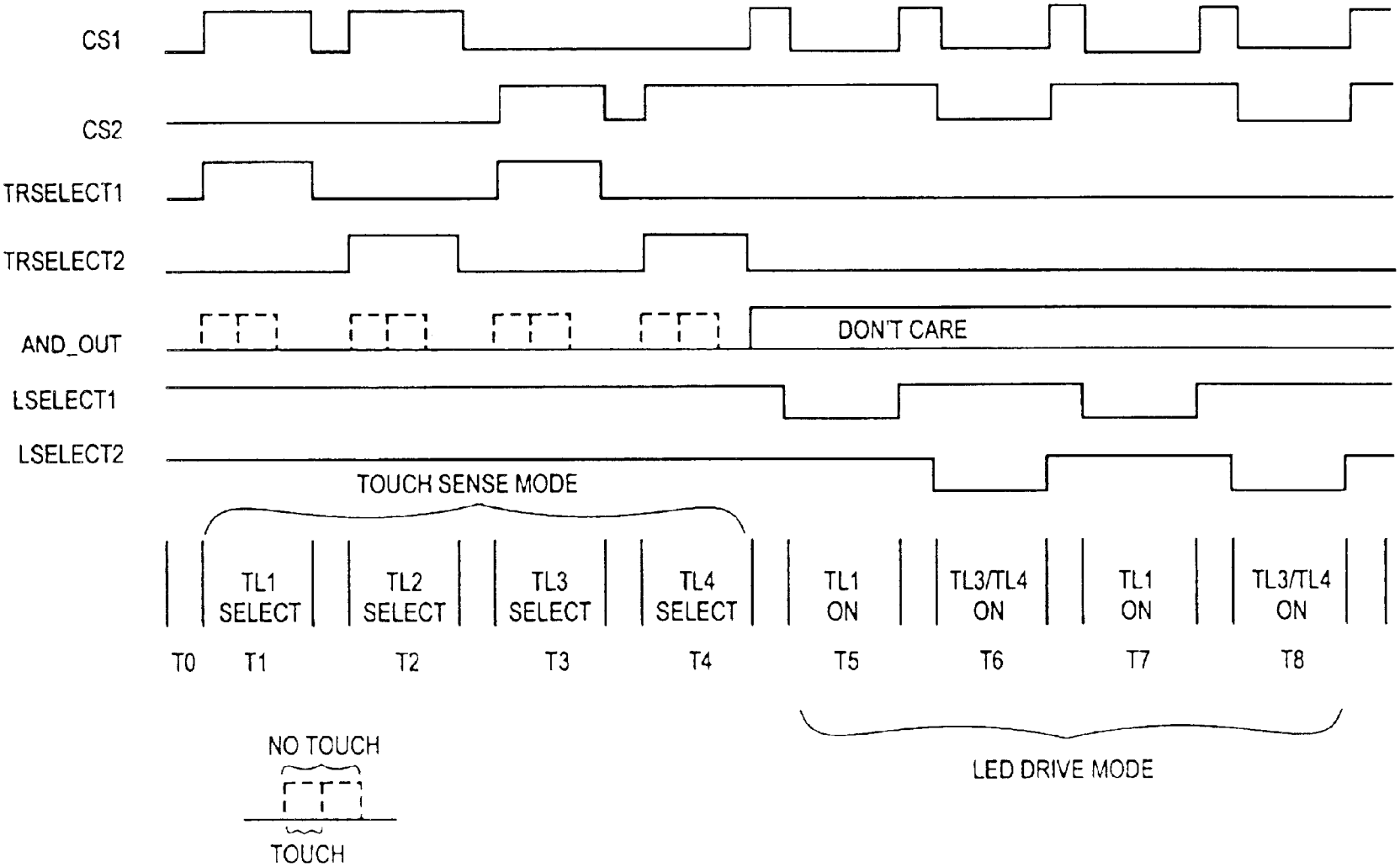
FIG. 8B is a timing diagram for the drive circuit of FIG. 8A.

FIG. 8A illustrates a possible drive circuit for the integrated light emitting touch sensors of FIGS. 6A–7D. FIG. 8B is a timing diagram for the drive circuit of FIG. 8A. The drive circuit of FIG. 8A advantageously requires only four address lines to control the touch sensor and light activation and operation of the entire matrix. Minimizing the number of address lines conserves space on the substrate that bears the integrated light emitting touch sensors and also reduces the complexity of the manufacturing process. The touch sensor function of integrated light emitting touch sensors TL1 and TL2 is activated when output CS1 of AND gate AND5 is high, which occurs when the inputs of AND gate AND5, namely, oscillating signal OSC and CSELECT1, are both high. The analog multiplexer AMP, including switches SW1 and SW2, controls whether the potential at one or the other or both of integrated light emitting touch sensors TL1 and TL2 become input 61 of AND gate AND, the output AND_OUT of which forms the touch sensor response output of the matrix of integrated light emitting touch sensors. Inputs LSELECT1 and LSELECT2 control active devices M5 and M6, which in turn control the light producing current through the integrated light emitting touch sensors, such that, for example, when LSELECT1 is low, active device M5 is biased on and RS1 is high. Capacitance $C_{isolate}$ can isolate AND gate AND from the effects of the light emitting operation of the drive circuit. As discussed above, although active devices M5 and M6 are shown as PMOS devices, NMOS, bipolar or other active devices can also be used.

According to FIG. 8A and the timing chart of FIG. 8B, at time T1, inputs oscillating signal OSC and CSELECT1 are both high causing output CS1 of AND gate AND5 to be high. Also at time T1, inputs LSELECT1 and LSELECT2 are both high, causing active devices M5 and M6 to be in high impedance mode, thus activating the integrated light emitting touch sensors TL1 and TL2. When input TRSELECT1 is high, switch SW1 will close and allow the signal from anode 121 of integrated light emitting touch sensor TL1 to reach AND gate AND, whose output AND_OUT is the response output of the drive circuit. Similar requirements exist for the activation of other individual integrated light emitting touch sensors or rows or columns thereof. As shown in FIG. 8B, when there is a touch stimulus to integrated light emitting touch sensor TL1, response output AND_OUT will persist for a relatively smaller portion of time T1 than when there is no stimulus. Stimulation of the other integrated light emitting touch sensors produces a similar response at response output AND_OUT. To activate the light emitting properties of integrated light emitting touch sensor TL1, output CS1 of AND gate AND5 must be low and input RS1 must be high. Under these conditions, current can flow from the anode to the cathode of the integrated light emitting touch sensors, causing them to emit light. As can be understood from FIG. 8B, active device M5 will be biased when its gate potential is lower than its source, as will occur when input LSELECT1 is low. When biased on, active device M5 will allow current to flow from anode 121 to cathode 123 of integrated light emitting touch sensor TL1. Integrated light emitting touch sensors TL2–TL4 operate in a similar manner. As can be understood from the drive circuit of FIG. 8A and the timing diagram of FIG. 8B, rows and columns of integrated light emitting touch sensors can be lit simultaneously as well. The timing diagram of FIG. 8B shows how the light emitting properties of the integrated light emitting touch sensors is synchronized. As discussed above, inputs CSELECT1, CSELECT2, TRSELECT1, TRSELECT2, LSELECT1 and LSELECT2 can be controlled by a logic circuit (not shown) to make the two modes of the system dependent on one another in any manner required for the particular application.

Figure 9A:
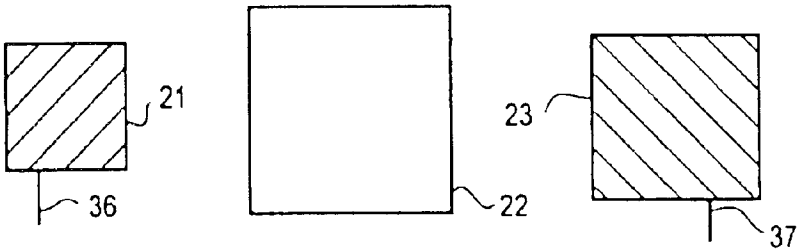
FIGS. 9A–9D illustrate the separate layers and construction of an integrated touch switch assembly including the capacitive touch switch assembly of FIGS. 4A–4B integrated with a light emitting device according to the present invention.
Figure 9B:
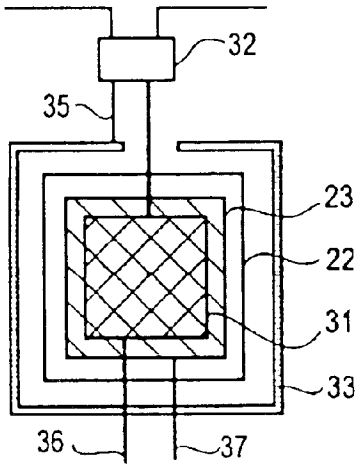
Figure 9C:
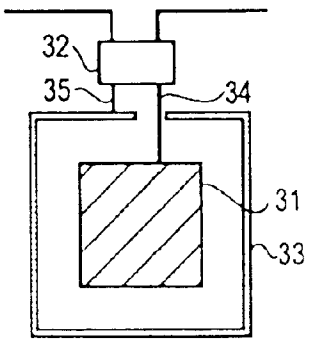
Figure 9D:
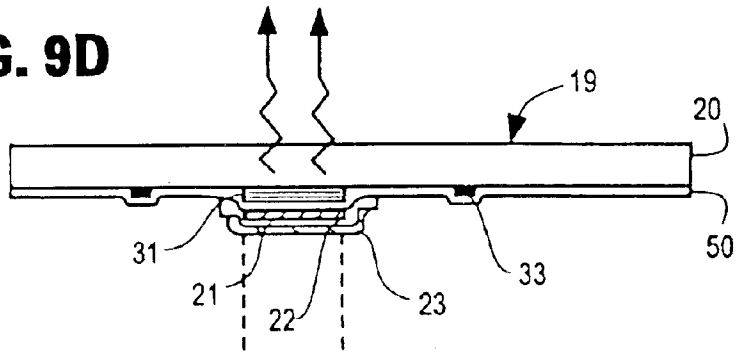

FIGS. 9A–9D illustrate the separate layers and construction of a touch switch with an integrated control circuit according to FIGS. 4A–4B physically integrated with, but electrically separate from, a bottom-emitting light emitting device. FIG. 9A shows the separate layers of the light emitting device, including anode 21, emissive stack 22 and cathode 23. Traces 36 and 37 connect to anode 21 and cathode 23, respectively. Anode 21 is preferably transparent to allow light from emissive stack 22 to reach surface 19 of substrate 20, but can be otherwise, as discussed above. FIG. 9C shows the touch switch with integrated control circuit of FIGS. 4A–4B, including electrode 31, integrated control circuit 32, electrode 33, trace 34 connecting electrode 31 to integrated control circuit 32 and trace 35 connecting electrode 33 to integrated control circuit 32. FIGS. 9B and 9D show how the separate layers of FIGS. 9A and 9C are integrated. FIG. 9D shows how the integrated assembly of FIG. 9B can be borne on substrate 20. Insulating layer 50 separates the touch sensor components of the touch switch assembly of FIG. 9C from the light emitting device and could also serve a decorative function. At least a portion of insulating layer 50 and substrate 20 should be transparent or translucent in order to allow light to pass therethrough from the light emitting device to surface 19.

Figure 9E:
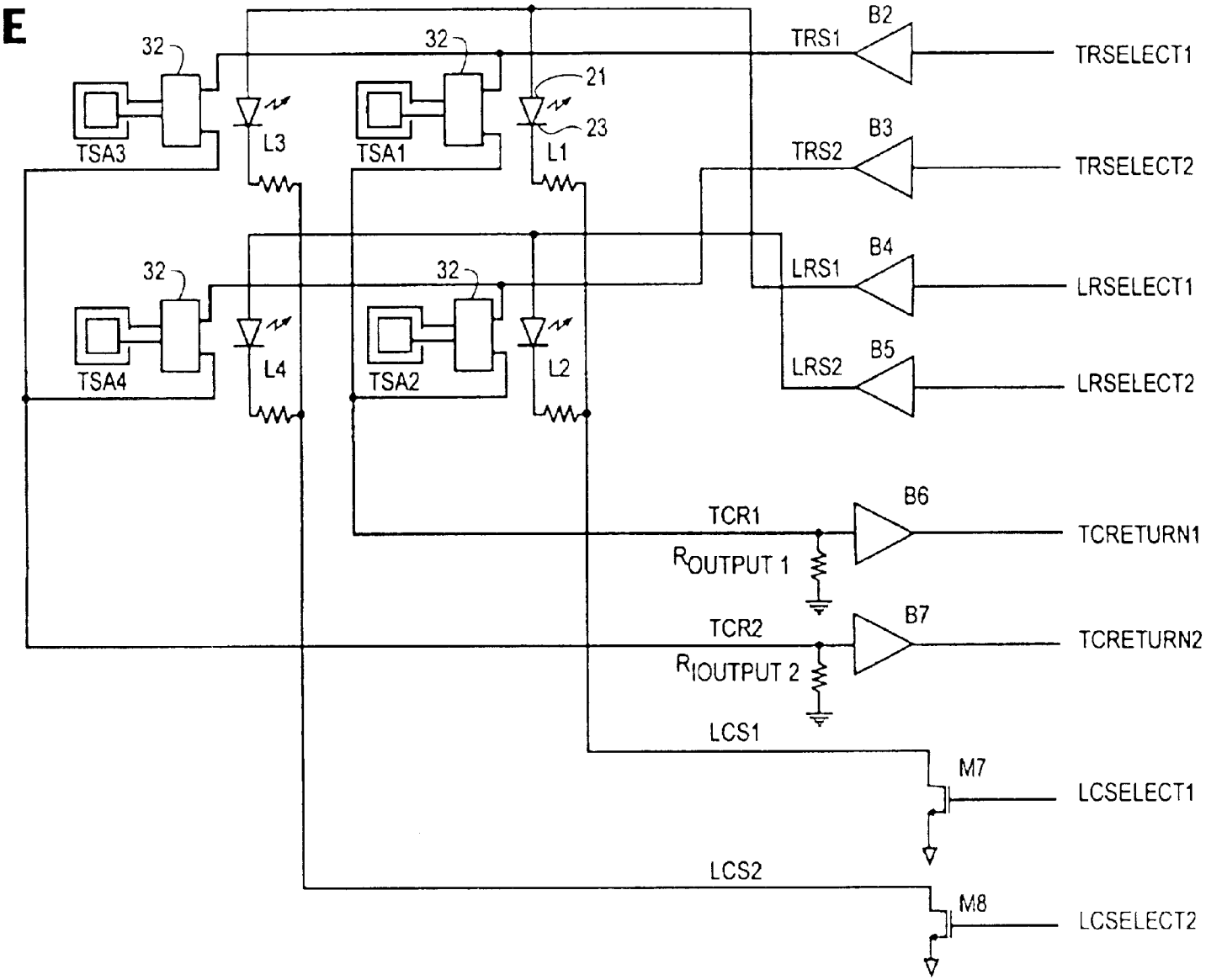
FIG. 9E illustrates a schematic representation of a drive circuit for a two-by-two matrix of the integrated touch switch assemblies of FIGS. 9A–9D.

FIG. 9E shows a possible drive circuit for the touch switch with integrated control circuit and integrated light emitting device of FIGS. 9A–9D arranged in a two-by-two matrix. As will be understood from FIG. 9E and from the preceding discussion, inputs of the drive circuit can be controlled by a logic circuit (not shown) to make the activation and operation of the touch switches and light emitting devices of the matrix behave dependently. The drive circuit of FIG. 9E includes buffers B2–B7 connected to inputs TRSELECT1, TRSELECT2, LRSELECT1, LRSELECT2 and outputs TCRETURN1 and TCRETURN2, respectively, and active devices M7 and M8, the gates of which are connected to LCSELECT 1 and LCSELECT 2, respectively. Inputs TRSELECT1 and TRSELECT2 control the activation of touch switch with integrated control circuit assemblies TSA1–TSA4. Outputs TCRETURN1 and TCRETURN2 respond to changes induced in the touch sensors of the touch switch with integrated control circuit assemblies TSA1–TSA4.

Figure 9F:
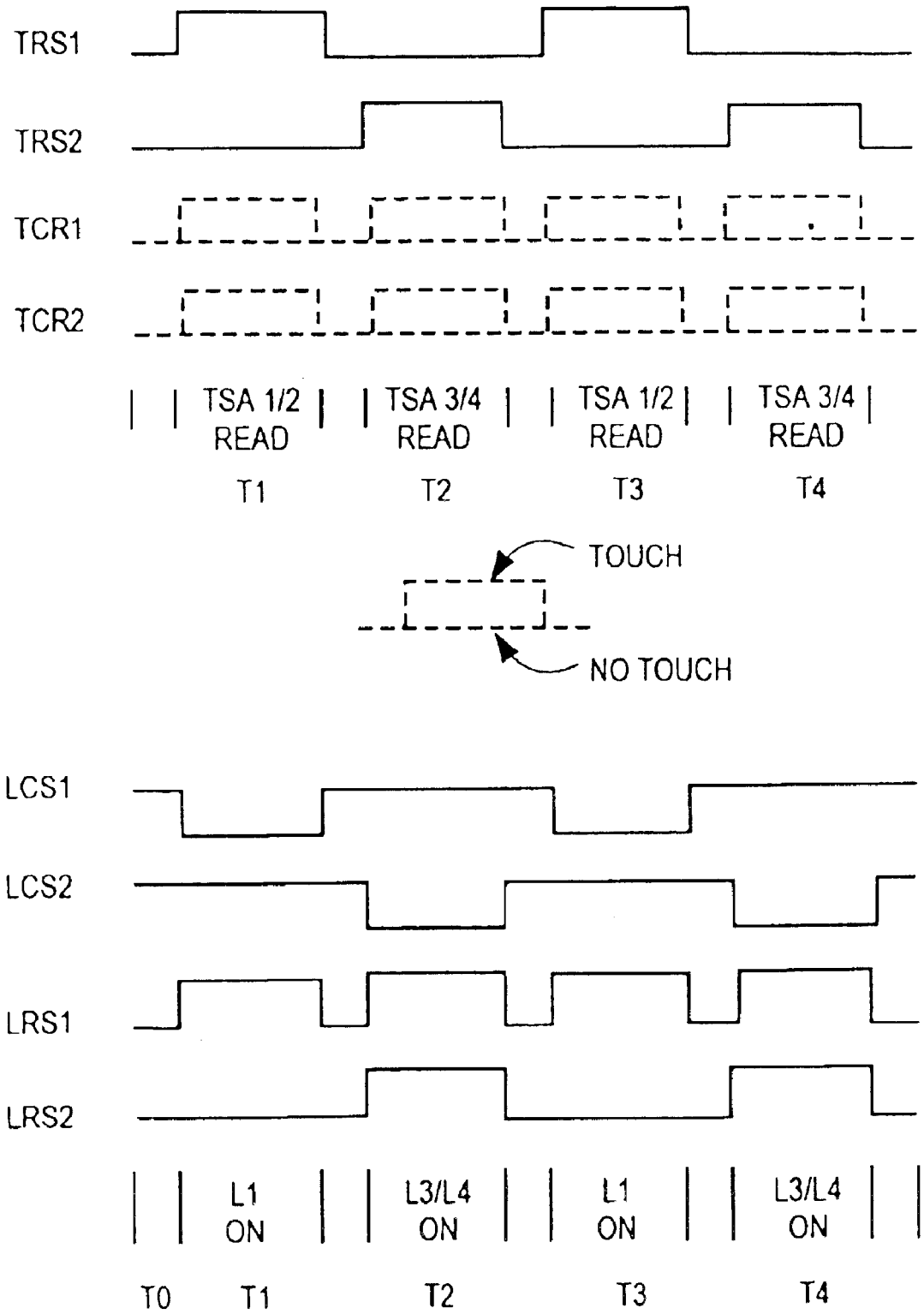
FIG. 9F is a timing diagram for the drive circuit of FIG. 9E.

As shown in the timing diagram of FIG. 9F, touch switch with integrated control circuit assemblies TSA1 and TSA3 are activated, receiving signals and can respond to stimuli to the electric fields about their electrodes when TRS1 of buffer B2 is high, activating the integrated control circuits 32 and touch sensors of touch switch with integrated control circuit assemblies TSA1 and TSA3. The output of the integrated control circuits 32 of the touch switch with integrated control circuit assemblies can involve a low voltage when the respective touch switches are not stimulated and a high voltage when they are. Outputs TCR1 and TCR2 can develop a current across resistors $R_{output1}$ and $R_{output2}$ that can be sent through buffers B6 and B7 to outputs TCRETURN1 and TCRETURN2 and ultimately to an end device.

Light emitting devices L1–L4 receive inputs LRS1, LRS2, from buffers B4 and B5, respectively, and inputs LCS1 and LCS2 from active devices M7 and M8. Light emitting device L1 will turn on and emit light at time T1 when, as shown in FIG. 9F, output LRS1 of buffer B4 is high, i.e., when input LCSELECT is high, and input LCS1 is low. In this condition, active device M7 will be biased on and provide a current path from anode 21 to cathode 23 of light emitting device L1. It will be understood, as discussed above and from FIGS. 9E and 9F, how other light emitting devices or rows or columns of light emitting devices can be similarly activated. Though the activation and operation of the touch switch with integrated control circuit and light emitting device assemblies is shown as being synchronized in FIG. 9F, other methods of activating and operating the assemblies and devices are possible.

Figure 10A:
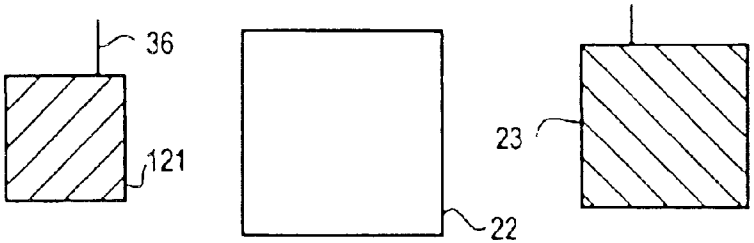
FIGS. 10A–10E illustrate the separate layers and construction of a bottom-emitting integrated light emitting touch switch assembly wherein the inner electrode of the touch switch assembly is a conductive layer of the light emitting device.
Figure 10B:
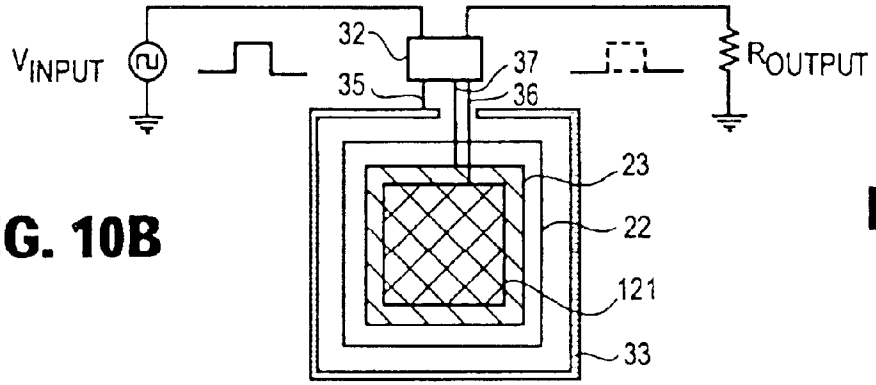
Figure 10C:
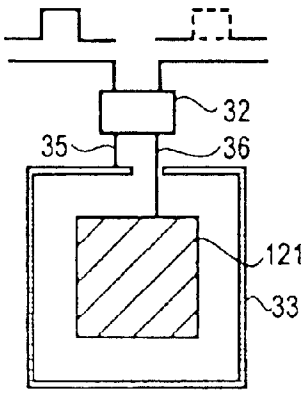
Figure 10D:
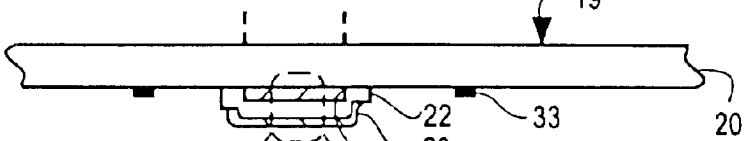
Figure 10E:
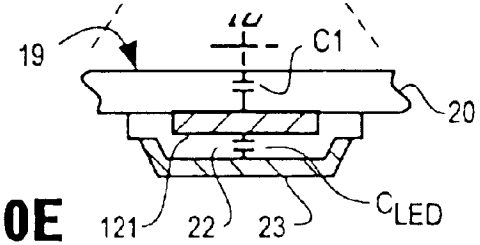

FIGS. 10A–10E illustrate the separate layers and construction of a bottom-emitting integrated light emitting touch switch with integrated control circuit assembly wherein the inner electrode 121 of the touch switch with integrated control circuit assembly is a conductive layer of the light emitting device. FIG. 10A shows the separate layers of the integrated light emitting touch switch with integrated control circuit, including anode 121, emissive stack 22 and cathode 23. FIG. 10C shows the touch switch with integrated control circuit assembly, including anode 121, electrode 33 and integrated control circuit 32. FIG. 10B shows the layers assembled into an integrated light emitting touch switch with integrated control circuit assembly. In FIG. 10B, traces 36, 37 and 35 connect anode 121, cathode 23 and electrode 33, respectively, to integrated control circuit 32. FIG. 10D shows a cross-section view of how the integrated light emitting touch switch with integrated control circuit assembly can be borne on substrate 20. In FIG. 10D, anode 121 overlies emissive stack 22, which in turn overlies cathode 23. Electrode 33 is borne on substrate 20 substantially surrounding the integrated light emitting touch switch with integrated control circuit assembly. FIG. 10E shows a schematic representation of capacitance C1 at surface 19 of substrate 20 and capacitance $C_{LED}$ between anode 121 and cathode 23. Integrated control circuit 32 of FIG. 10B can control the activation and operation of the touch switch and light emitting layers 22 of the integrated light emitting touch switch assembly. The integrated light emitting touch switch assembly of FIG. 10B can form a low impedance touch sensing device. Anode 121 is preferably, though not necessarily, transparent. The integrated light emitting touch switch with integrated control circuit assembly of FIGS. 10A–10E can be controlled by the control circuit depicted in FIGS. 11A–11B.

Figure 11A:
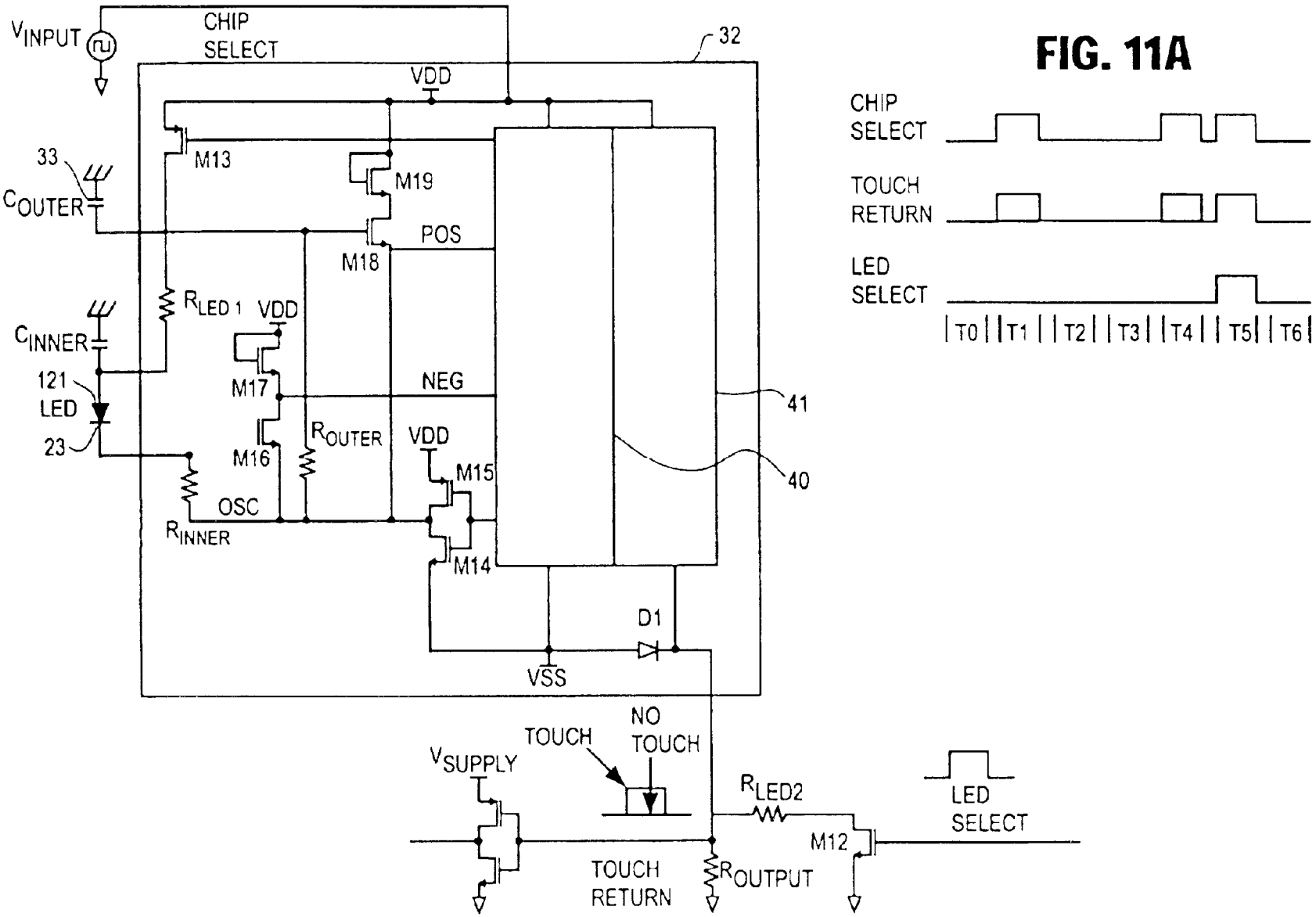
FIGS. 11A–11B illustrate a schematic representation of control circuits for the integrated touch switch assembly of FIG. 10A–10E.
Figure 11B:
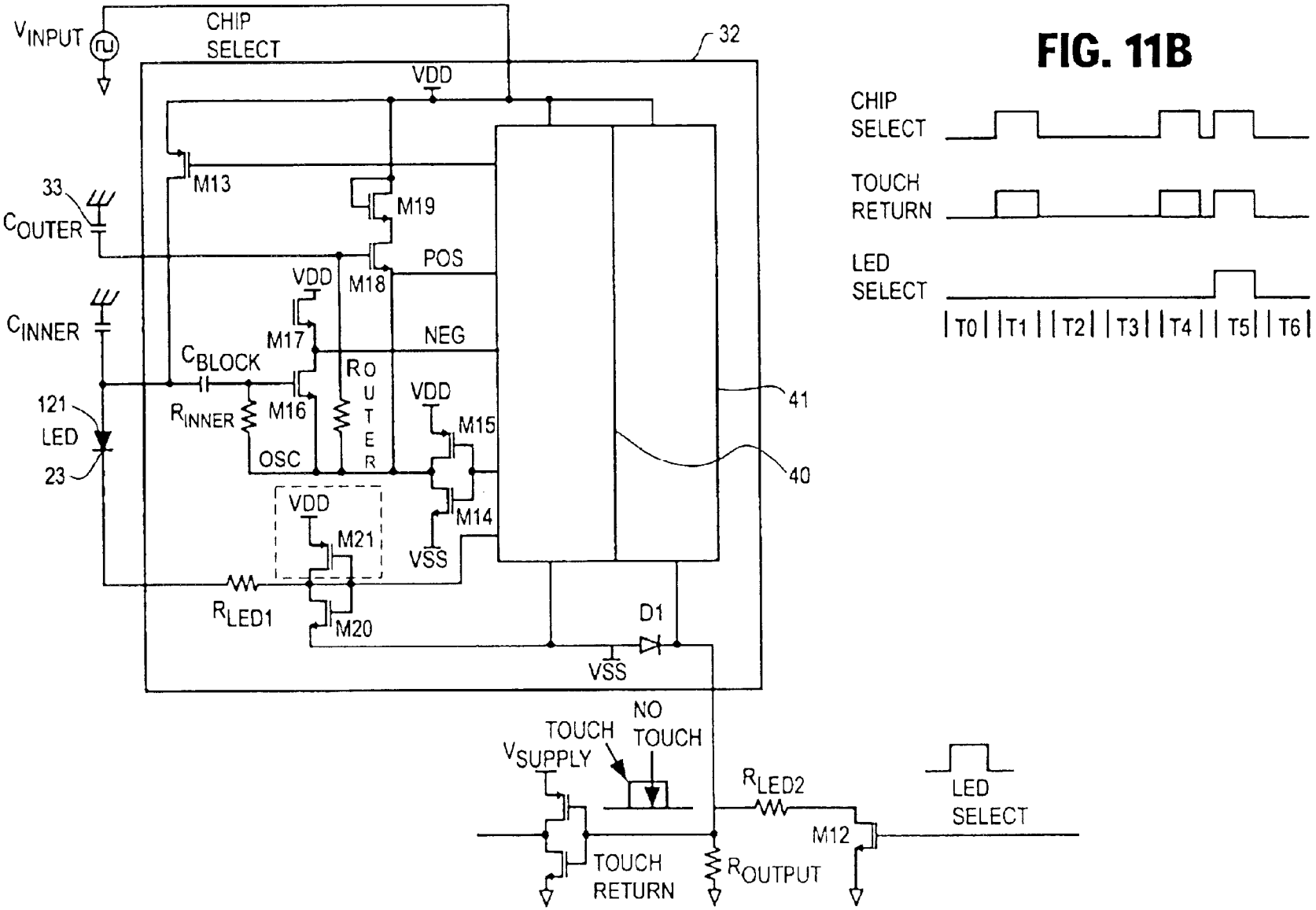

FIGS. 11A–11B show schematic representations of control circuits capable of controlling the integrated light emitting touch switch with integrated control circuit assemblies of FIG. 10. In FIGS. 11A–11B, integrated control circuit 32 produces a differential response output through logic and decision circuit 40 and latch circuit 41. In FIG. 11A, oscillating signal OSC from logic and decision circuit 40 activates electrodes 121 and 33 through the buffering configuration of active devices M14 and M15 and through electrodes $R_{inner}$ and $R_{outer}$, respectively. Anode 121 is activated by oscillating signal OSC through the relatively large coupling capacitance of light emitting device LED. Active device M13 is shown connected to logic and decision circuit 40, to anode 121 of light emitting device LED through resistance $R_{LED1}$ and to chip select signal VDD. Active device M12 is shown connected to cathode 23 of light emitting device LED through resistance $R_{LED2}$, diode D1 and active device M14. During the touch sensing operation of the control circuit, active devices M13 and M12 are unbiased and in a non-conducting high impedance state and the operation of the control circuit is similar to the operation of the control circuits described with reference to FIG. 4C and in U.S. Pat. No. 6,320,282. During the LED drive operation of the control circuit, active devices M14, M13 and M12 will be biased on, conducting and low impedance, and chip select signal VDD will be applied to the source of active device M13, allowing current to flow with low impedance through resistance $R_{LED1}$, anode and cathode 21 and 23 of light emitting device LED and resistances $R_{inner}$ and $R_{LED2}$. The current flowing through light emitting device LED will cause it to emit light.

FIG. 11B shows how oscillating signal OSC can drive anode 121 directly, instead of through the relatively large coupling capacitance of light emitting device LED. The control circuit of FIG. 11B includes active device M13, connected to logic and decision circuit 40, chip select signal VDD and anode 121 and active device M20, connected to logic and decision circuit 40 and to cathode 23 of light emitting device LED through resistance $R_{LED1}$. Also, capacitance $C_{block}$ can isolate the touch sensing circuit from DC current through light emitting device LED during LED drive operation of the drive circuit. Optional active device M21 can provide an AC ground for the touch sensor. The control circuit of FIG. 11B works as does the drive circuit of FIG. 11A during touch sensing operation. During LED drive operation, active devices M20, M13 and M12 will be biased on, conducting and low impedance, and chip select signal VDD will be applied, allowing current to flow through light emitting device LED and resistances $R_{LED1}$ and $R_{LED2}$. In both FIGS. 11A and 11B, current can be limited by altering the values of the various resistances and characteristics of the active devices. Although PMOS or NMOS devices have been shown in certain locations within the control circuit, it will be understood that other devices, including bipolar devices, could be used as well. FIG. 13F illustrates a timing diagram that can correspond to the operation of a matrix of touch sensors with integrated control circuits 32 like the one depicted in FIGS. 11A or 11B.

Figure 12A:
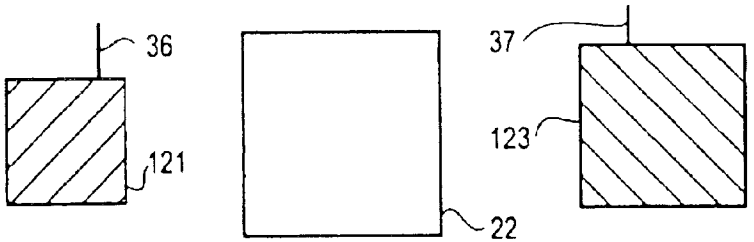
FIGS. 12A–12E illustrate the separate layers and construction of a bottom-emitting integrated light emitting touch switch assembly wherein the electrode of the touch switch assembly is a conductive layer of the light emitting device.
Figure 12B:
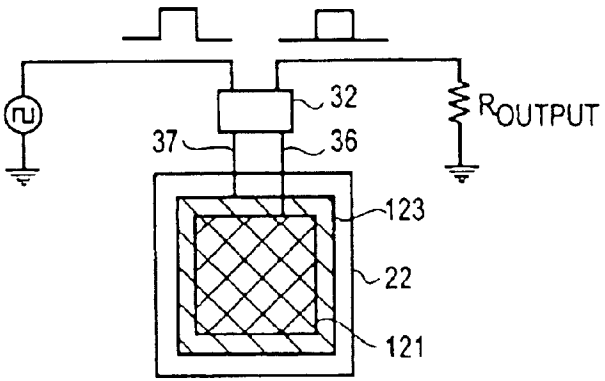
Figure 12C:
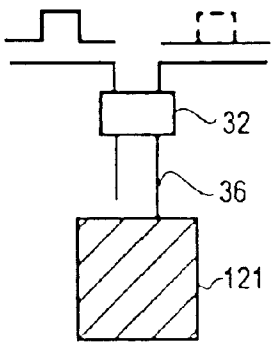
Figure 12D:
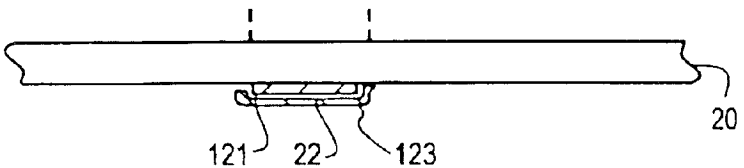
Figure 12E:
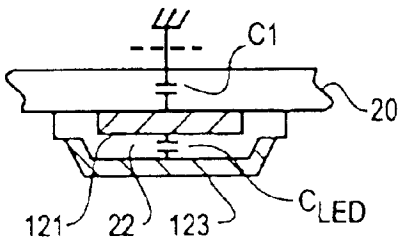

FIGS. 12A–12E illustrate the separate layers and construction of a bottom-emitting integrated light emitting touch switch with integrated control circuit assembly wherein the single electrode 121 of the touch switch assembly is a conductive layer of the light emitting device. FIG. 12A shows the separate layers of the integrated light emitting touch sensor, including anode 121, emissive stack 22 and cathode 123. Trace 37 can connect cathode 123 to integrated control circuit 32, as shown in FIG. 12B. FIG. 12C shows the touch sensor including anode 121 and trace 36 connecting anode 121 to integrated control circuit 32 in single electrode mode. FIG. 12B shows how the separate layers can be assembled to form an integrated light emitting touch switch with integrated control circuit assembly. FIG. 12D shows a cross-section view of how the assembly of FIG. 12B can be borne on substrate 20. In FIG. 12D, anode 121 overlies emissive stack 22, which overlies cathode 123. FIG. 12E shows a schematic representation of capacitance C1 between surface 19 of substrate 20 and capacitance $C_{LED}$ between anode 121 and cathode 123. Integrated control circuit 32 of FIG. 10B can control the activation and operation of the touch switch and light emitting layers of the integrated light emitting touch switch assembly. The integrated light emitting touch switch assembly of FIG. 10B can form a low impedance touch sensing device. Anode 121 is preferably, though not necessarily, transparent. Also, at least a portion of substrate 20 should be transparent or translucent to allow light to pass therethrough from the light emitting device to surface 19.

FIGS. 13A–13D illustrate the separate layers and construction of a top-emitting integrated light emitting touch switch with integrated control circuit assembly wherein the single electrode 121 of the touch switch assembly is a conductive layer of the light emitting device. FIGS. 13A–13D are as described with reference to FIGS. 12A–12D, except that anode 121, emissive stack 22 and cathode 123 of the FIGS. 13A–13D embodiment are borne on surface 19 of substrate 20 and covered by decorative layer 59, while integrated control circuit 32 is borne on the other side of substrate 20, opposite surface 19, and connected to anode 121 and cathode 123 through substrate 20 via traces 36 and 37, respectively. To accommodate traces 36 and 37, substrate 20 can, but need not, include cutout sections or can be formed around the traces during manufacture of the touch switch with integrated control circuit assembly. Traces 36 and 37 also could be connected to integrated control circuit 32 using separate traces built into substrate 20. As discussed above, decorative layer 59 could be replaced by a second substrate (not shown) and can include transparent areas to allow light from emissive stack 22 to reach the user of the integrated light emitting touch switch with integrated control circuit assembly.

Figure 13A:
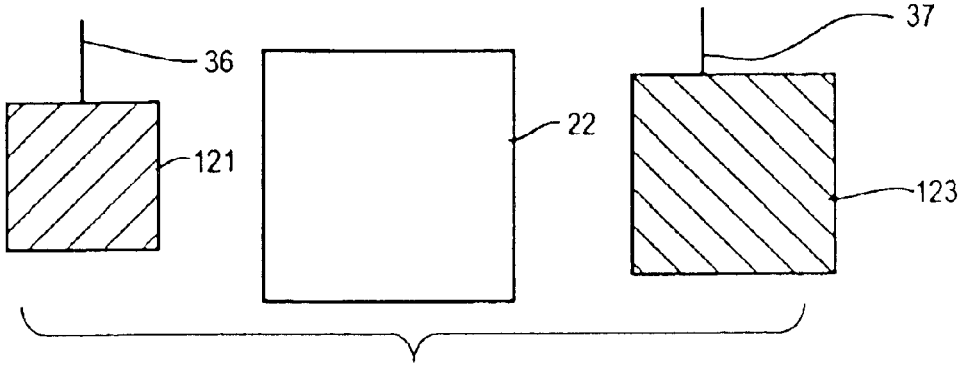
FIGS. 13A–13D illustrate the separate layers and construction of a top-emitting integrated light emitting touch switch assembly wherein the electrode of the touch switch assembly is a conductive layer of the light emitting device.
Figure 13B:
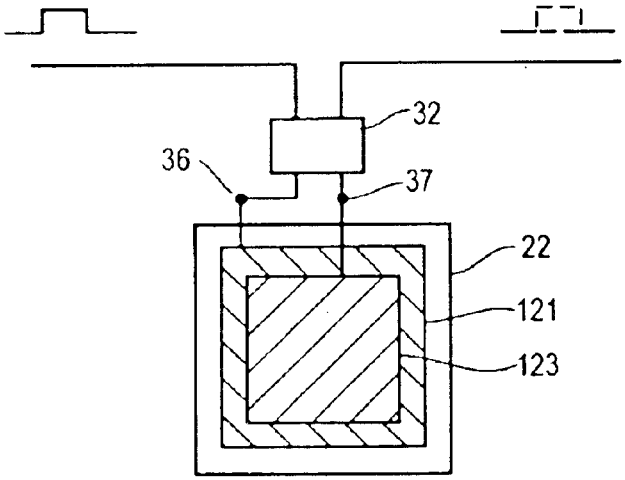
Figure 13C:
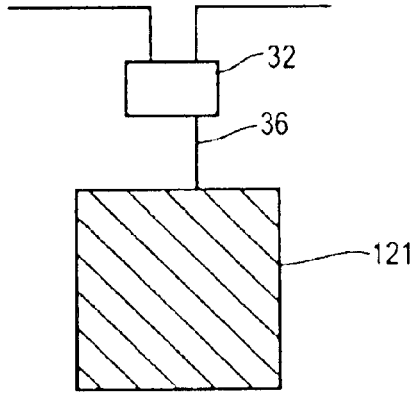
Figure 13D:
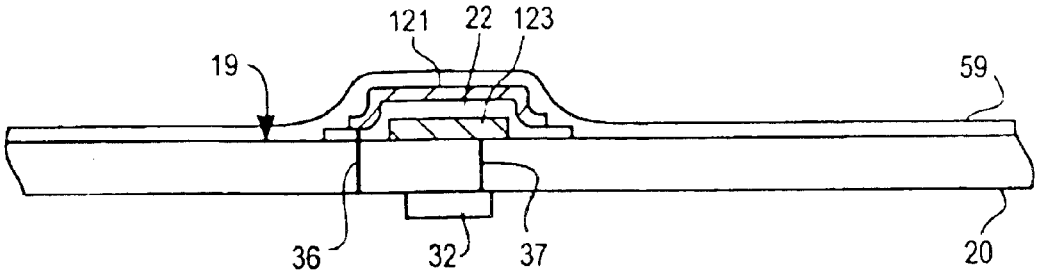
Figure 13E:
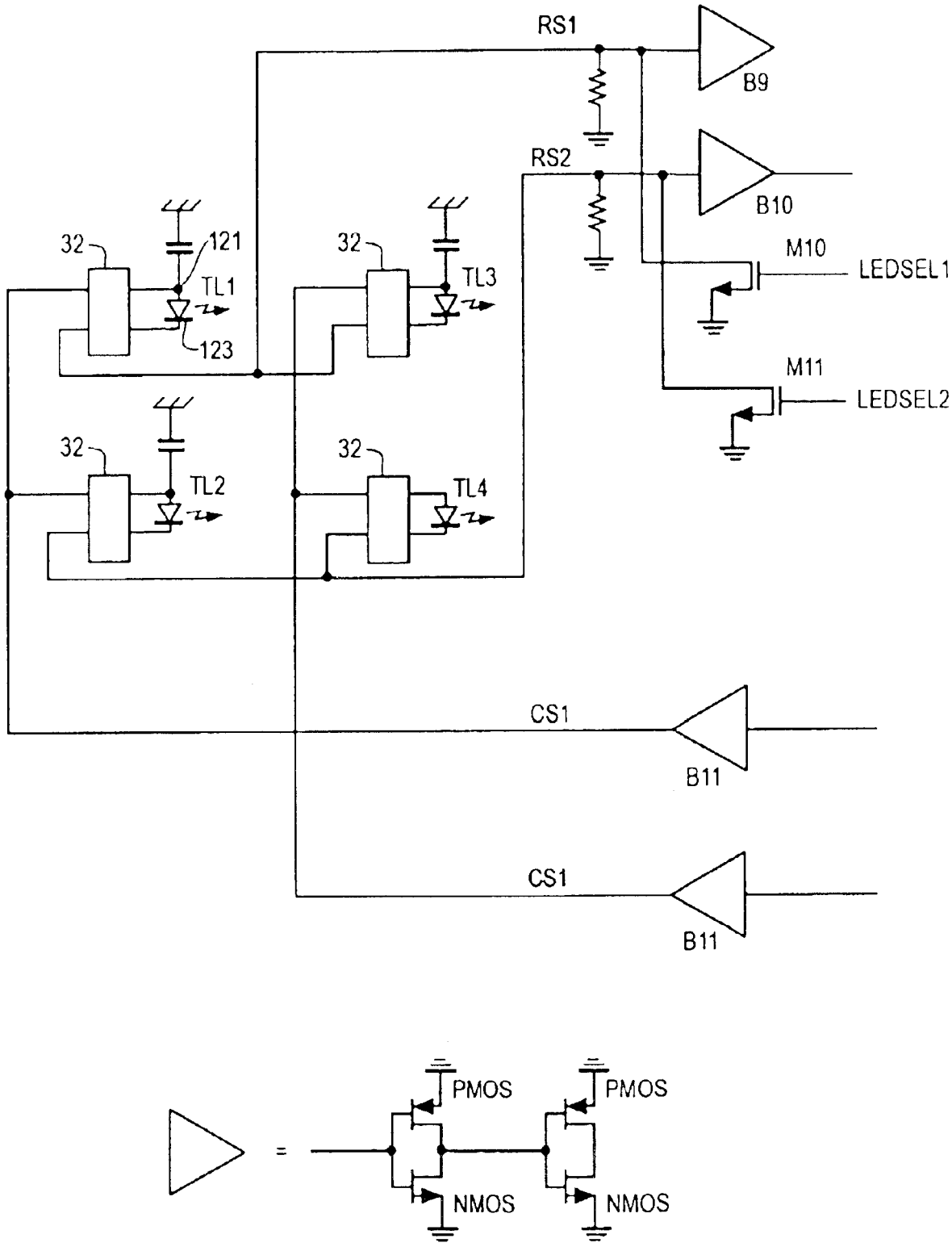
FIG. 13E illustrates a schematic representation of a drive circuit for a two-by-two matrix of the integrated touch switch assemblies with integrated light emitting devices of FIGS. 10A–13D.
Figure 13F:
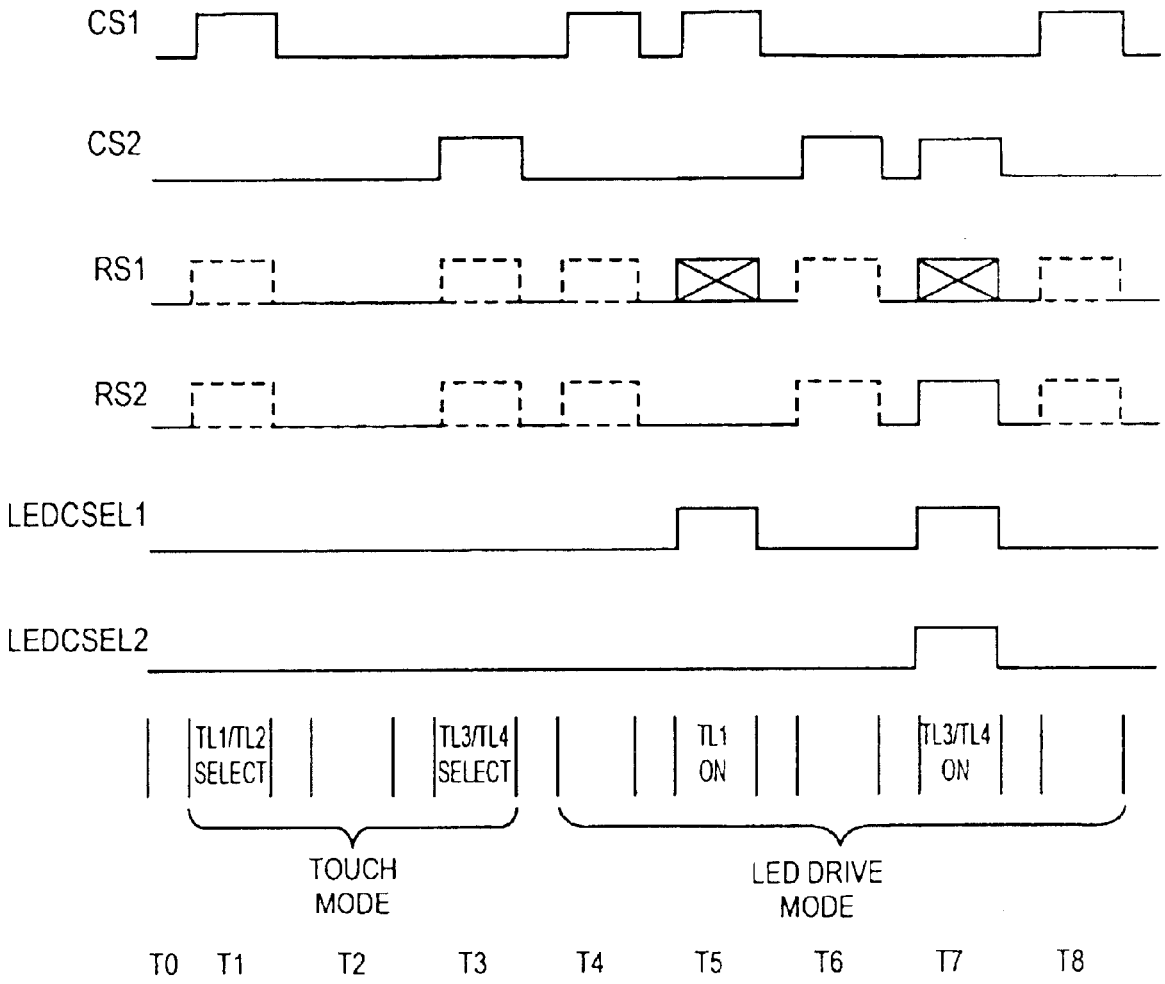
FIG. 13F is a timing diagram for the drive circuit of FIG. 13E.

The activation and operation of a two-by-two matrix of the integrated light emitting touch switch with integrated control circuit assemblies of FIGS. 12A–13D can be controlled by the drive circuit of FIG. 13E according to the timing diagram of FIG. 13F. Other drive circuits and timing schemes also can be used. The drive circuit of FIG. 13E advantageously requires only four address lines, which, as discussed above with respect to FIG. 8A, conserves space and reduces the complexity of the touch switch matrix configuration and its manufacture. The drive circuit of FIG. 13E includes inputs CS1 and CS2, which control the touch switch activation of columns of integrated light emitting touch switch with integrated control circuit assemblies within the matrix, and inputs LEDSEL1 and LEDSEL2, which control the light activation of rows of integrated light emitting touch switch assemblies. Returns RS1 and RS2 are touch switch response outputs of the integrated control circuits 32 of the two rows of integrated light emitting touch switch assemblies. Buffers B9–B10 buffer the input signals and buffers B11–B12 buffer the response output signals. Active devices M10 and M11 can be biased on by inputs LEDSEL1 and LEDSEL2 to allow current to flow from the anode through the emissive layers and to the cathode of the integrated light emitting touch switch with integrated control circuit assemblies TL1–TL4 to produce light. The signals of the timing diagram of FIG. 13F are shown synchronized, but as discussed above, could be otherwise. At time T1, the touch sensor function of integrated light emitting touch switch assemblies TL1 and TL2 is activated because input CS1 is high. The touch sensor function of integrated light emitting touch switch with integrated control circuit assemblies TL3 and TL4 is not activated because input CS2 is low. Thus, at time T1, either one or both of integrated light emitting touch switch with integrated control circuit assemblies TL1 and TL2 could relay a touch stimulated signal to response output RS1 or RS2, respectively.

At time T5, integrated light emitting touch switch with integrated control circuit assembly TL1 emits light and its touch sensor function is activated because input CS1 is high at times T4 and T5. Also, input LEDSEL1 is high and consequently active device M10 is biased on, allowing current to flow through it.

The touch sensor and light activation of the other integrated light emitting touch switch with integrated control circuit assemblies is similar to the activation of integrated light emitting touch switch with integrated control circuit assembly TL1. It will be understood for FIGS. 13E and 13F that rows and columns of integrated light emitting touch switch with integrated control circuit assemblies can also act as touch switches and emit light as well. The touch sensor operation and light emission of the integrated light emitting touch switch with integrated control circuit assemblies of FIG. 13E are therefore shown synchronized such that an integrated light emitting touch switch with integrated control circuit assembly will emit light only when touch stimulated. Other patterns of activation could also be advantageous as discussed above.

Figure 14A:
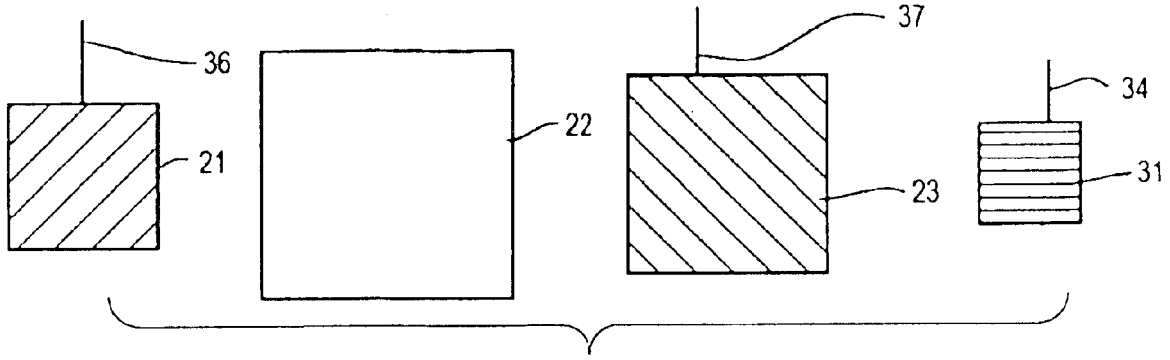
FIGS. 14A–14C illustrate the separate layers and construction of a bottom-emitting touch switch assembly according to the present invention including a capacitive touch switch assembly of FIG. 5A–5B and an integrated light emitting device.
Figure 14B:
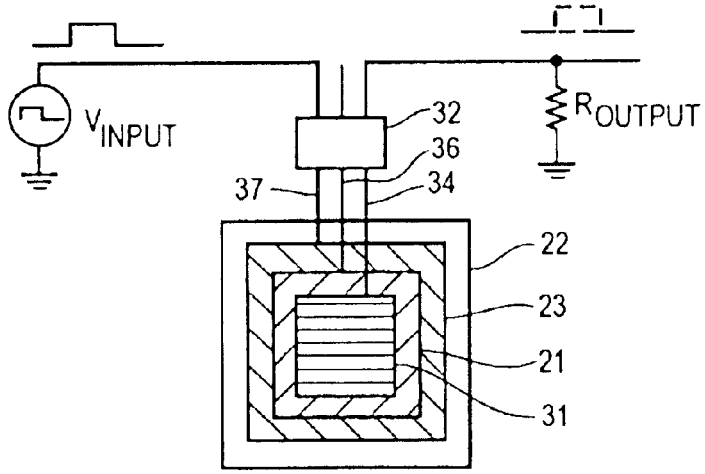
Figure 14C:
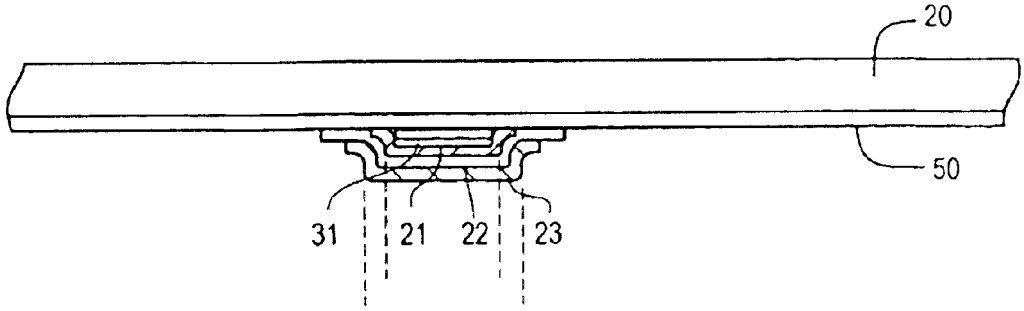

FIGS. 14A–14C illustrate the separate layers and construction of a bottom-emitting touch switch with integrated control circuit assembly according to the present invention including a touch switch with integrated control circuit assembly of FIG. 5A–5B and an integrated light emitting device. FIG. 14A shows the separate layers of the light emitting device and the touch sensor, including anode 21, emissive stack 22, cathode 23 and electrode 31. FIG. 14B shows how the separate layers can be assembled and connected through traces 34, 36 and 37 to integrated control circuit 32. FIG. 14C shows a cross-section view of how the assembly of FIG. 14B can be borne on substrate 20. In FIGS. 14B and 14C, electrode 33 is shown overlying anode 21, which in turn overlies emissive stack 22 and cathode 23. Insulating layer 50 separates electrode 31 from the layers of the light emitting device. Insulating layer 51 is preferably transparent and can be $SiO_2$ or any other suitable dielectric material.

Electrode 31 and anode 21 are also preferably transparent but, as described above, need not be. As shown in FIGS. 14A–14C, electrode 31 and anode 21 could be smaller than emissive stack 22, allowing the light emitting device to form a border or halo around even a non-transparent electrode 31 or anode 21. Thus, in certain applications, a transparent electrode and anode need not be used. A possible control circuit for the integrated light emitting touch switch assembly of FIG. 14C is described with reference to FIGS. 15C–15D.

Figure 15A:
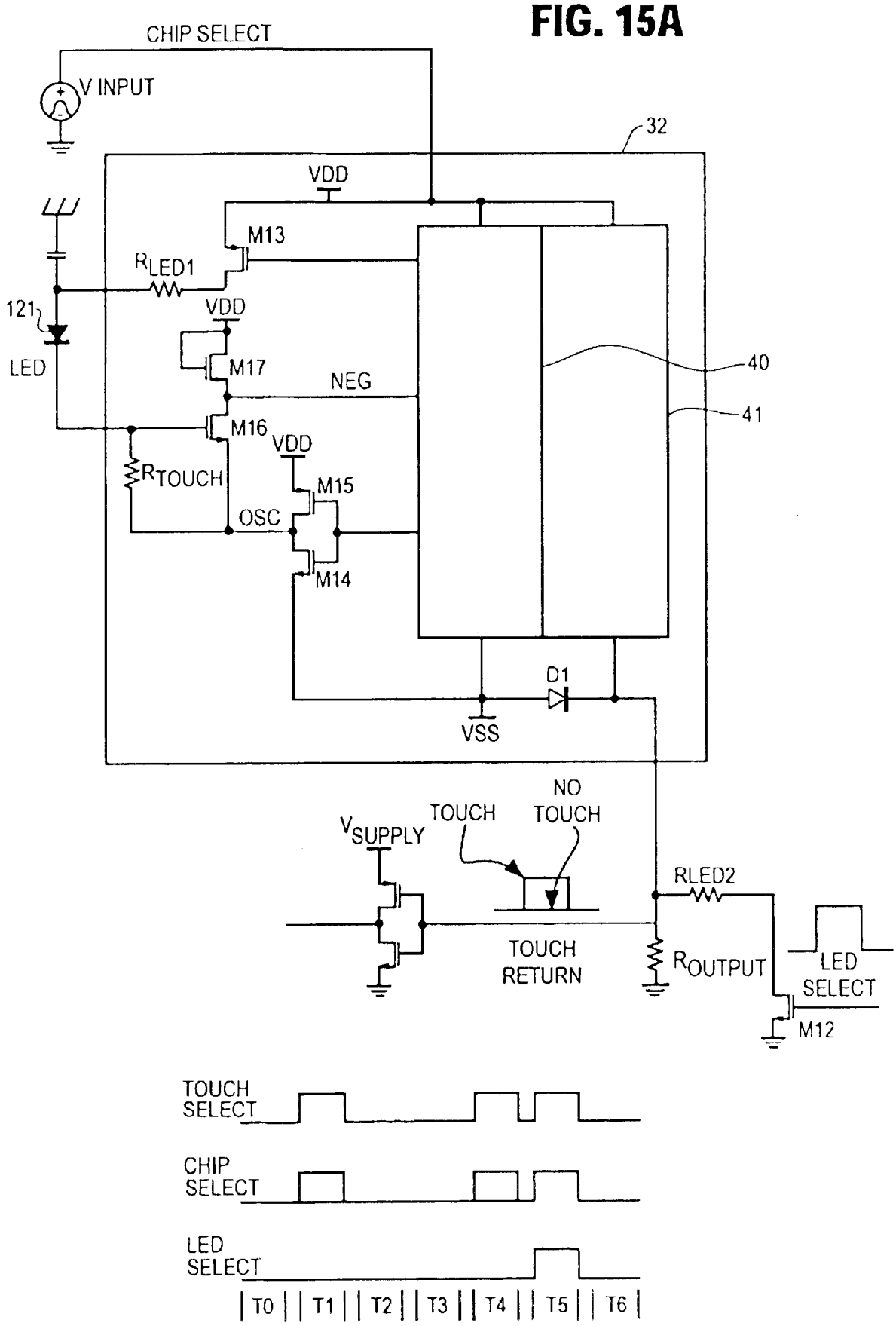
FIGS. 15A–15B illustrate schematic representations of control circuits for the integrated light emitting touch switch assemblies of FIGS. 12A–13D wherein the electrode of the touch switch assemblies is a conductive layer of the light emitting devices
Figure 15B:
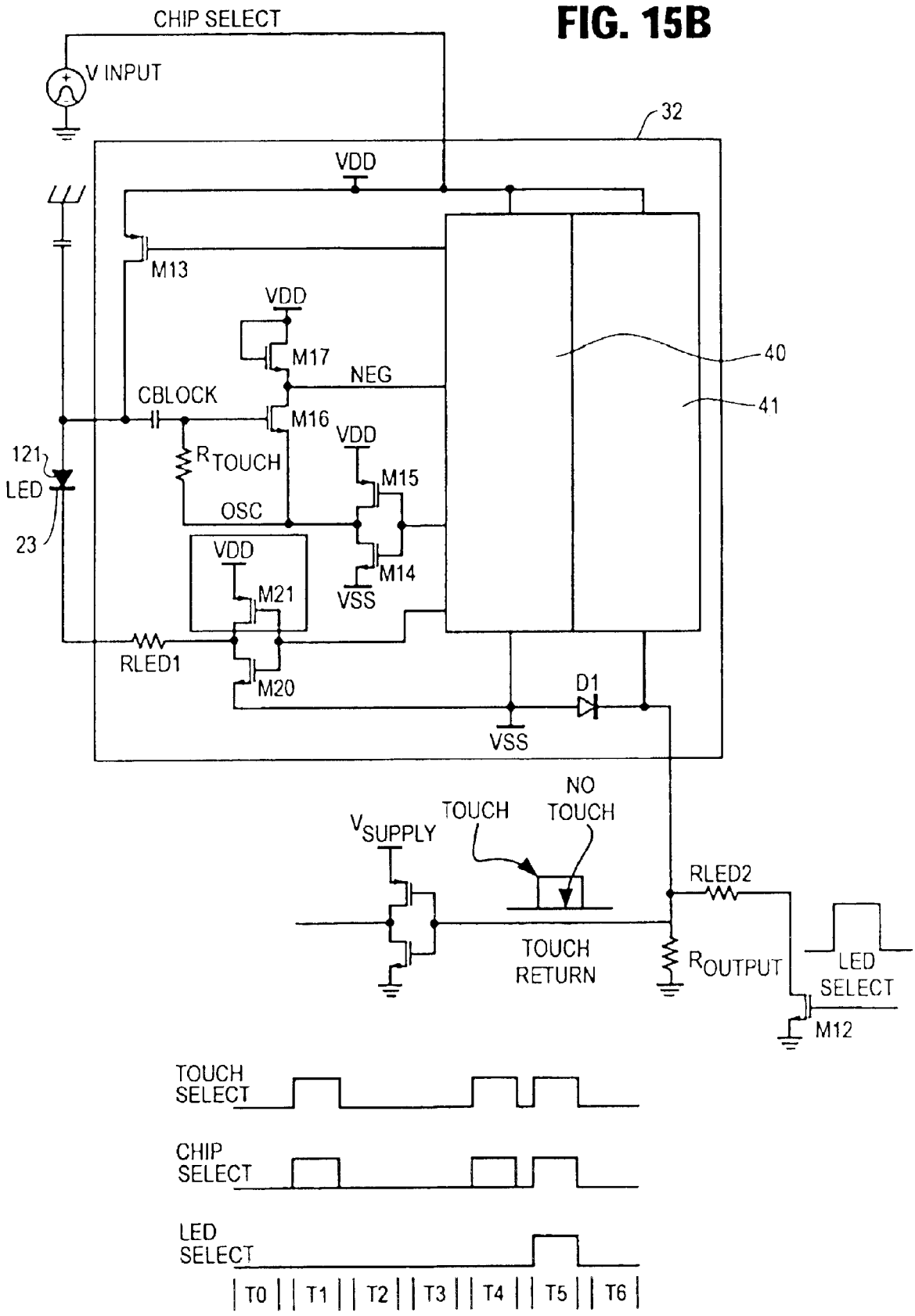

FIGS. 15A–15B show schematic representations of possible control circuits capable of controlling the integrated light emitting touch switch with integrated control circuit assemblies of FIGS. 12D and 13D, involving anode 121. Anode 121 in FIGS. 15A–15B is connected to integrated control circuit 32 as described with reference to FIGS. 11A–11B. Here, resistance $R_{inner}$ has been renamed $R_{touch}$, because the integrated light emitting touch switch with integrated control circuit assemblies of FIGS. 12D and 13D do not include inner and outer electrodes. During the touch sensing operation of the control circuit, active devices M12 and M13 will be unbiased, nonconducting and high impedance, and the control circuit will operate in a manner similar to the manner described with reference to FIGS. 11A–11D, except that logic and decision circuit 40 will have only one input and therefore will not provide a differential output to latch circuit 41. FIG. 15B shows a control circuit capable of activating anode 121 directly and not through the relatively large coupling capacitance of light emitting device LED. During LED drive operation, the control circuit of FIG. 15B operates as described with reference to FIG. 11B.

Figure 15C:
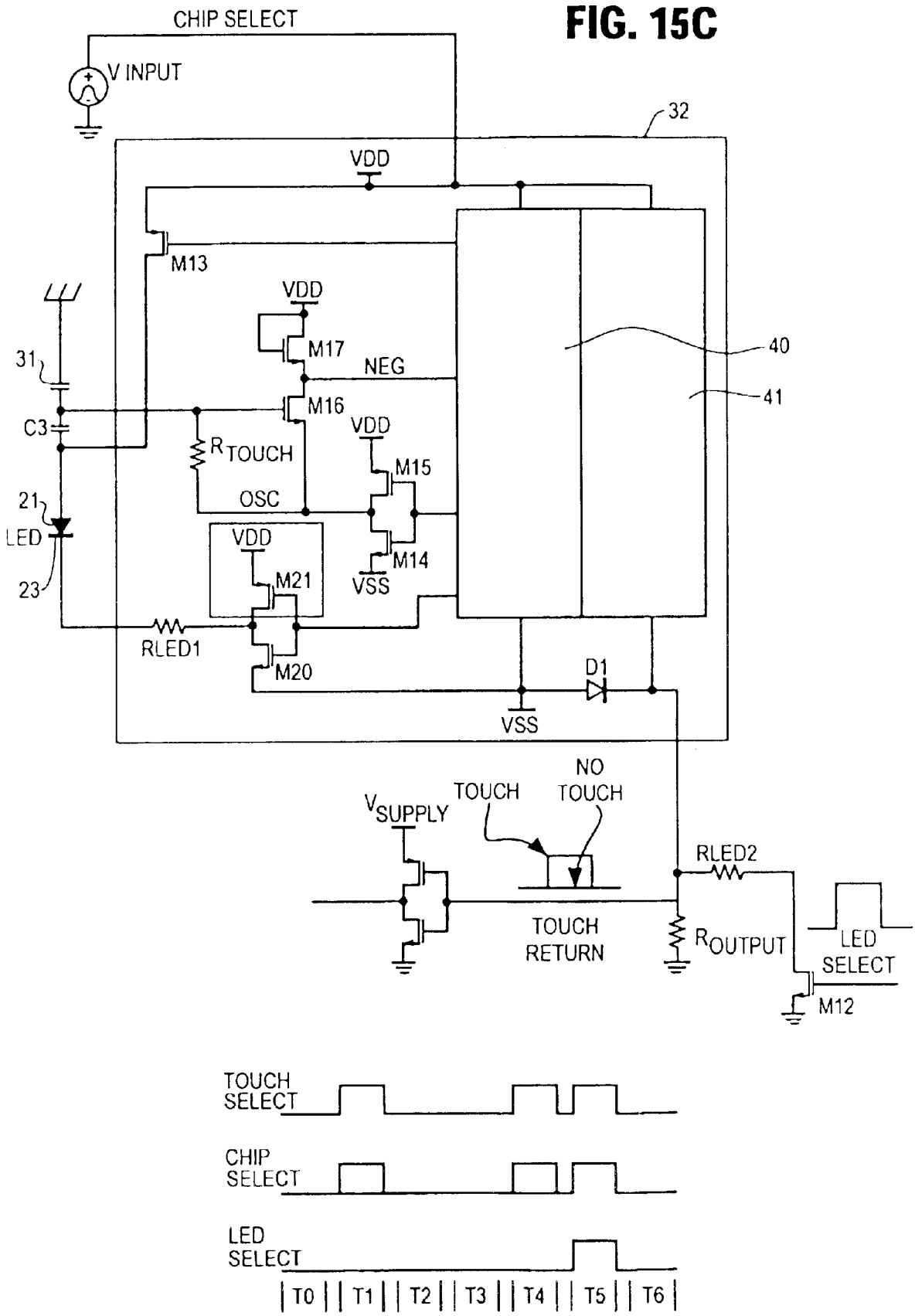
FIG. 15C illustrates a schematic representation of a control circuit for the integrated touch switch assemblies according to the present invention of FIGS. 14A–14D.

FIG. 15C illustrates a schematic representation of a possible control circuit capable of controlling the integrated light emitting touch switch with integrated control circuit assembly of FIG. 14C. During touch sensing operation, the control circuit of FIG. 15C works as described above with reference to FIG. 15B. Also, during touch sensing operation there is no DC path for current flow through light emitting device LED, other than leakage current, for this control circuit. During light emitting device LED drive operation, capacitance C3 between electrode 31 and anode 21 isolates the touch switch operation circuitry from the current of the LED drive operation of the circuit. As shown in FIG. 14C, capacitance C3, represented schematically in FIG. 15C, is provided by isolating layer 50, which may be any suitable material including $SiO_2$.

Figure 15D:
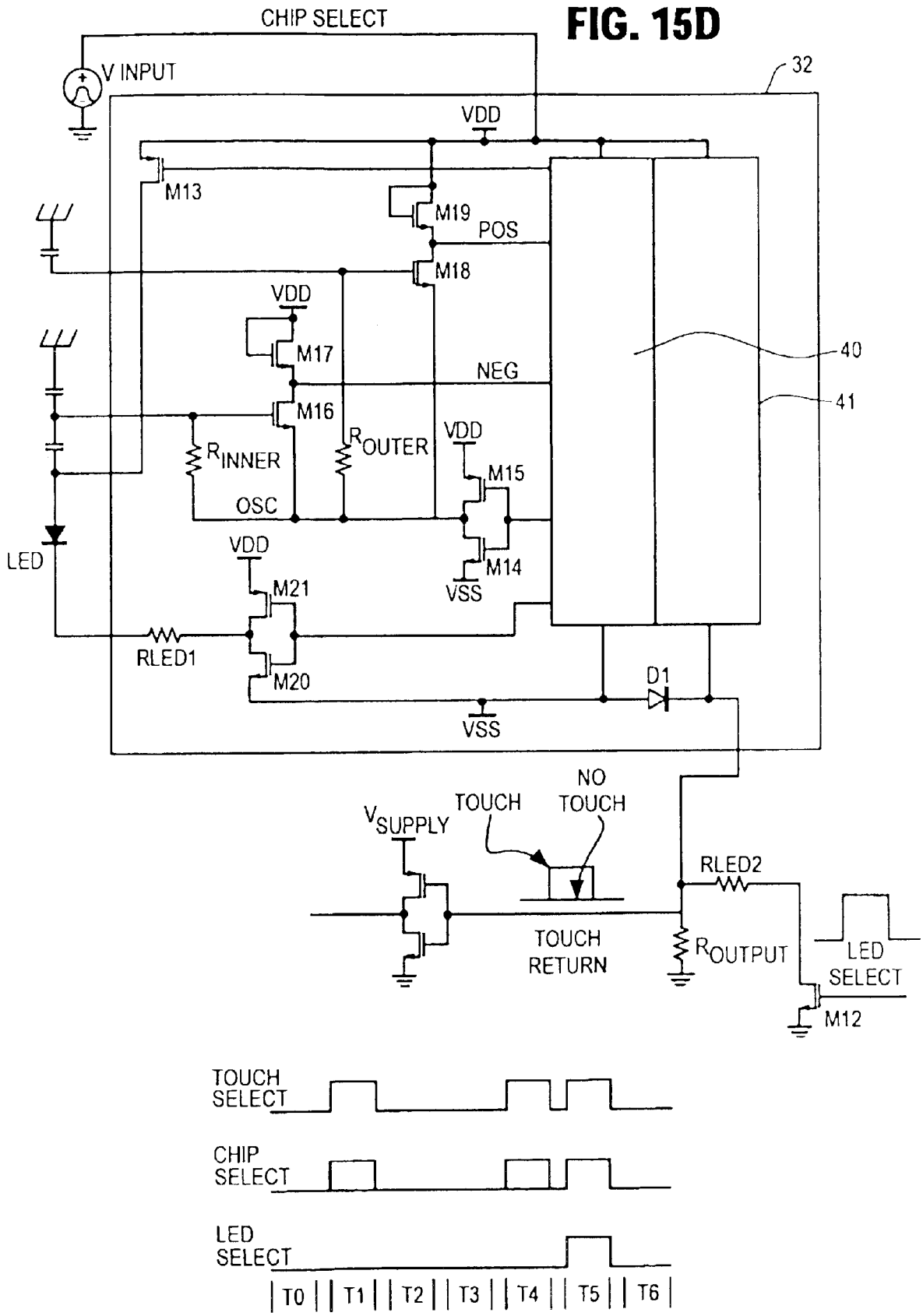
FIG. 15D illustrates a schematic representation of a control circuit for the integrated touch switch assembly according to the present invention of FIGS. 9A–9D.

FIG. 15D illustrates a schematic representation of a possible control circuit capable of controlling the integrated light emitting touch switch assembly shown generally in FIG. 14C, but further including an outer electrode 33. The control circuit in FIG. 15D works as described above with reference to FIG. 15C, except that electrode 33, active devices M18 and M19 and resistance $R_{outer}$ provide input to logic and decision circuit 40, which can be capable of providing a differential output to latch circuit 40.

Figure 16A:
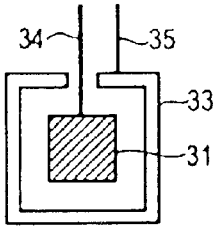
FIGS. 16A–16J illustrate touch switches where the light emitting device is coupled with the touch detection electrodes but is neither atop nor underneath them.
Figure 16B:
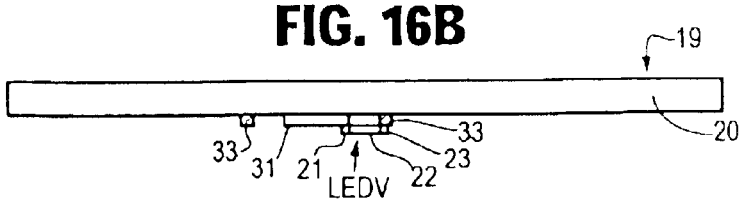
Figure 19:
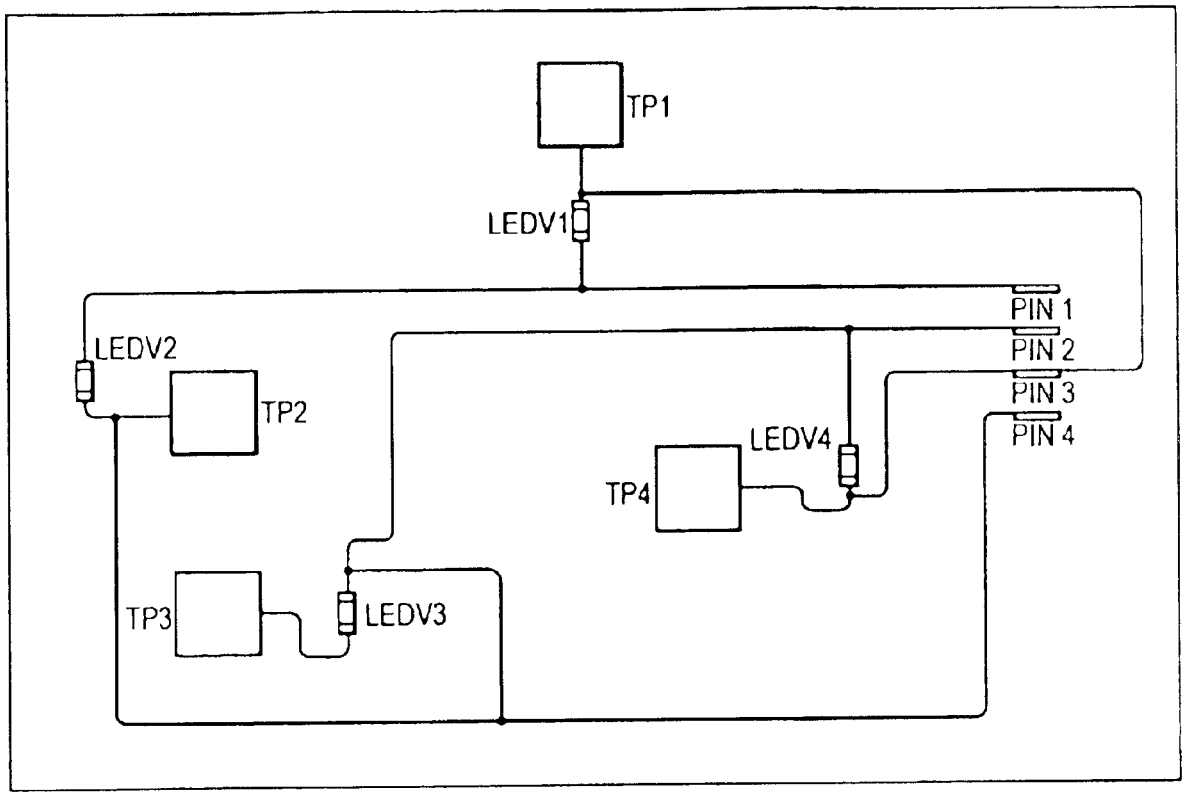
FIG. 19 illustrates an arrangement of four touch switches each coupled to a light emitting device located remote from the touch pads of the touch switches.

FIG. 16A shows the electrodes 31 and 32 and traces 34 and 35 of a touch pad. FIGS. 16B–16J show light emitting devices LEDV, which can be, for example, inorganic semiconducting diodes, having anode 21, emissive junction 22 and cathode 23 coupled to electrodes 31 and 33 of the touch pad of FIG. 16A at anode 21 and cathode 23, respectively. The configurations depicted in FIGS. 16B–16J show how inorganic semiconducting diodes and other light emitting devices can, according to the present invention, be located in various locations relative to the touch pad with which they are coupled, including remote from the electrodes of the touch pad. Such configurations can provide flexibility in the design of integrated light emitting touch sensor devices and can at the same time offer simple addressing schemes, as shown in FIG. 19, described below. In FIG. 16B, light emitting device LEDV is oriented between electrodes 31 and 33 so that light can reach surface 19 of substrate 20 without having to pass through either electrode 31 or 33. Thus, electrodes 31 and 33 need not be transparent to allow light to reach surface 19 of substrate 20, shown in FIG. 16B. To allow light from light emitting device LEDV to reach surface 19, substrate 20 is preferably transparent. FIGS. 16C–16J, like FIG. 16B, each illustrate touch switches where a light emitting device is coupled with the touch detection electrodes 31 and 33 but is neither atop nor underneath them, allowing light emitted from light emitting device LEDV to reach surface 19 and obviating the need for transparent electrodes.

Figure 16C:
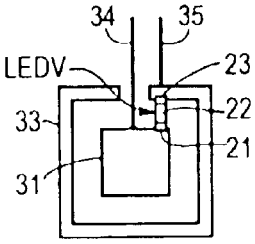
Figure 16D:
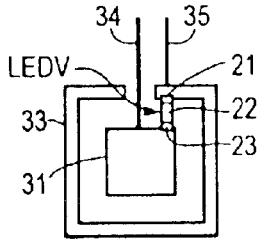
Figure 16E:
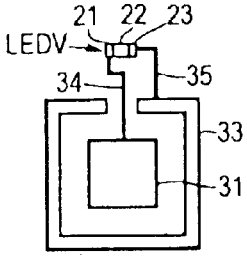
Figure 16F:
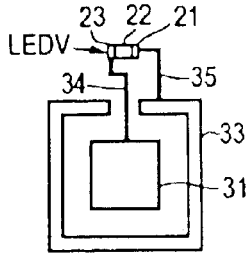
Figure 16G:
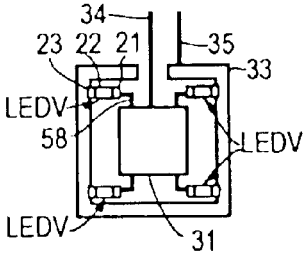
Figure 16H:
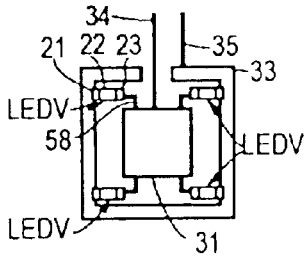
Figure 16I:
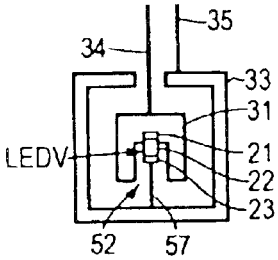
Figure 16J:
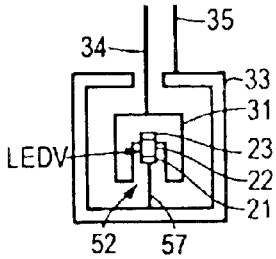
Figure 17A:
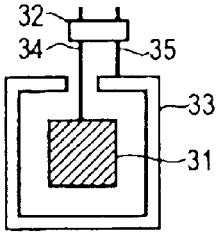
FIGS. 17A–17J illustrate the configurations of FIGS. 16A–16J where the touch switches include an integrated control circuit proximate the touch detection electrodes.
Figure 17B:
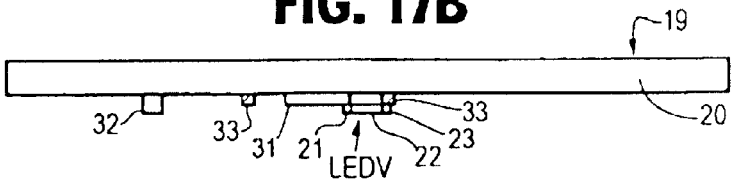
Figure 17C:
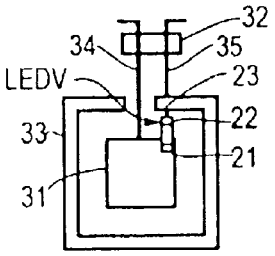
Figure 17D:
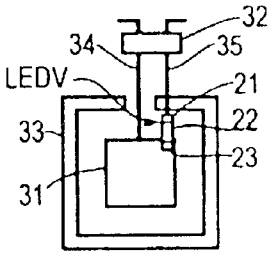
Figure 17E:
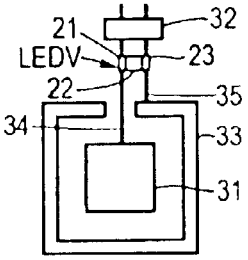
Figure 17F:
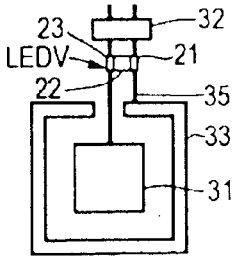
Figure 17G:
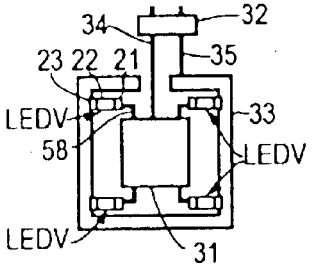
Figure 17H:
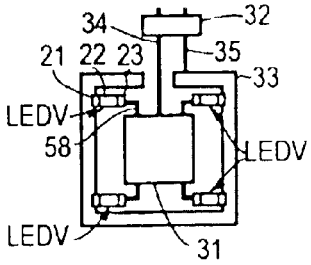
Figure 17I:
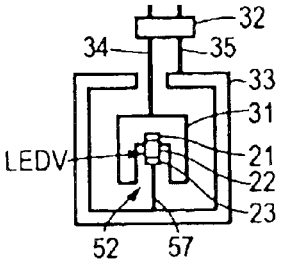
Figure 17J:
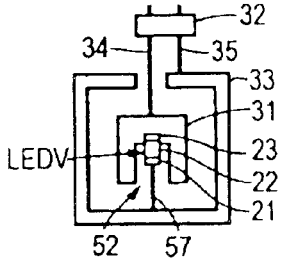

In FIGS. 16C and 16D, emissive stack 22 of light emitting device LEDV is located between electrode 31 and electrode 33. Anode 21 and cathode 23 are coupled to electrode 31 and electrode 33 in FIG. 16C, and vice versa in FIG. 16D. Anode 21 and cathode 23 could also be directly composed of electrode 31 or electrode 33, eliminating the need from small circuit traces or integration of the electrodes. In FIGS. 16E and 16F, light emitting device LEDV is located remote from electrodes 31 and 33 and anode 21 and cathode 23 are coupled to electrodes 31 or 33 through traces 34 and 35. Electrodes 31 and 33 could be coupled to a control circuit (not shown) either through traces 34 and 35 as well or through other, separate traces (not shown). In FIGS. 16G and 16H, each touch switch has four light emitting devices LEDV located between electrode 31 and electrode 33. In FIG. 16G, traces 58 connect anode to electrode 31, where in FIG. 16H, traces 58 connect cathode 23 to electrode 31. In FIG. 16I and 16J, electrode 31 has a notch 52 that accommodates light emitting device LEDV. In FIG. 16I, anode 21 is coupled to electrode 31 and cathode 23 is coupled to electrode 33 through trace 57, where in FIG. 16J, cathode 23 is coupled to electrode 31 and anode 21 is coupled to electrode 33 through trace 57. In both FIGS. 16I and 16J, notch 52, and consequently light emitting device LEDV, is shown located in the center of electrode 31. Other such configurations and variations on the configurations shown in these drawings are possible as well.

In addition to obviating the need for transparent electrodes, configurations according to this embodiment of the present invention (where a light emitting device LEDV is alongside the electrodes of a touch pad) can also provide other benefits. For instance, light emitted from light emitting devices LEDV in FIGS. 16E–16F can reach surface 19 at a location remote from the electrodes of the touch pad while also being integrated according to the principles of the present invention. FIGS. 17A–17J illustrate the configurations of FIG. 16A–16J where the touch switches also include an integrated control circuit 32 proximate the touch detection electrodes 31 and 33.

Figure 18A:
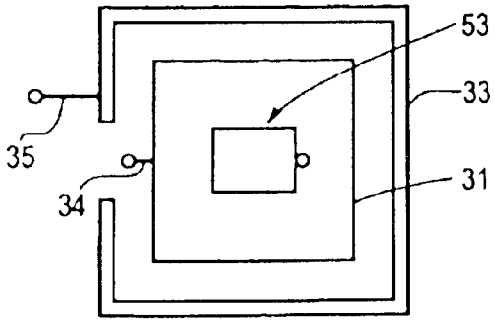
FIGS. 18A–18D illustrate a touch switch where a light emitting device and an aperture in a touch detection electrode are aligned with an aperture in the carrier substrate and a transparent window in a decorative layer.
Figure 18B:
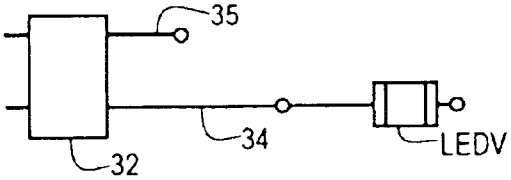
Figure 18C:
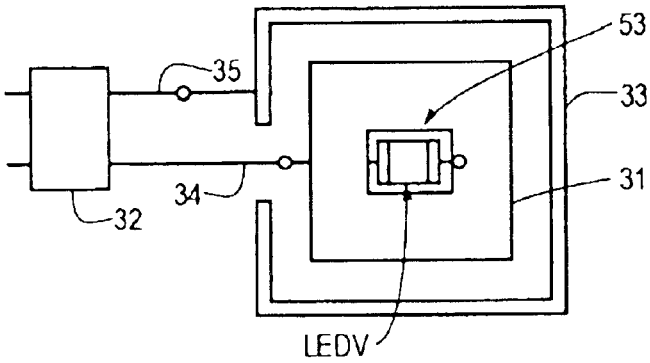
Figure 18D:
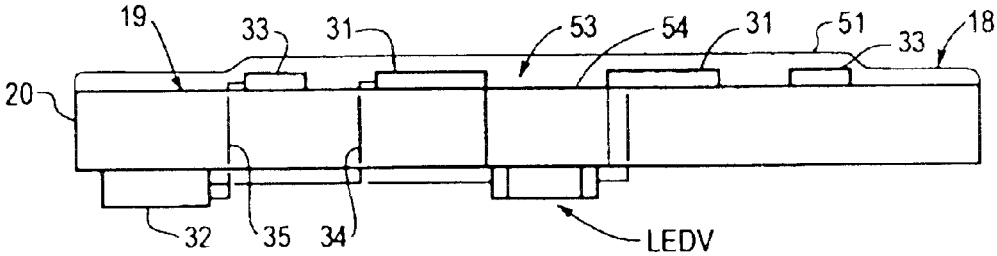

FIGS. 18A–18D illustrate a touch switch with integrated control circuit where light emitting device LEDV and an aperture 53 in touch detection electrode 31 are aligned with window 54 in substrate 20. In FIG. 18D, showing a cross-section view of the assembled touch switch with integrated control circuit and light emitting device, decorative layer 51 is disposed on substrate 20 atop electrodes 31 and 33. Decorative layer 51 is preferably either transparent or translucent, at least in an area aligned with light emitting device LEDV and window 54, to allow light from light emitting device LEDV to reach surface 18 of decorative layer 51. FIG. 18A shows electrodes 31 and 33 coupled to traces 34 and 35, respectively. In FIG. 18A, electrode 31 includes aperture 53.

FIG. 18B shows integrated control circuit 32 coupled to traces 34 and 35. In FIG. 18B, trace 35 is also coupled to light emitting device LEDV. FIGS. 18C and 18D show the configurations of FIGS. 18A and 18B assembled together. In FIGS. 18C and 18D, aperture 53 is shown aligned with light emitting device LEDV. In FIG. 18D, substrate 20 is shown with window 54, which is also aligned with light emitting device LEDV. Window 54 is preferably also either translucent or transparent to allow light from light-emitting device LEDV to reach surface 18 of decorative layer 51. Alternatively, substrate 20 could be entirely translucent or transparent in place of incorporating window 54 into substrate 20. The touch switch depicted in FIG. 18D also has decorative layer 51, which can have a translucent portion (not shown) aligned with window 54 of substrate 19 or can be completely translucent and the like. Since electrodes 31 and 33 are on side 19 of substrate 20 opposite the side bearing integrated control circuit 32 and light emitting device LEDV, traces 34 and 35 must penetrate substrate 20 to be coupled to electrodes 31 and 33 as well as integrated control circuit 32 and light emitting device LEDV.

FIG. 19 illustrates an arrangement of four touch pads electrically coupled to four light emitting devices. In FIG. 19, light emitting devices LEDV1–LEDV4 are coupled to touch pads TP1–TP4, respectively, and both touch pads TP1–TP4 and corresponding light emitting devices LEDV1–LEDV4 are coupled to input/output pins P1–P4, respectively, which in turn can be coupled to an integrated control circuit (not shown). As shown in FIG. 19, light emitting devices LEDV1–LEDV4 can be remote from the touch pads of a touch switch and can at the same time be integrated according to the present invention.

Figure 20A:
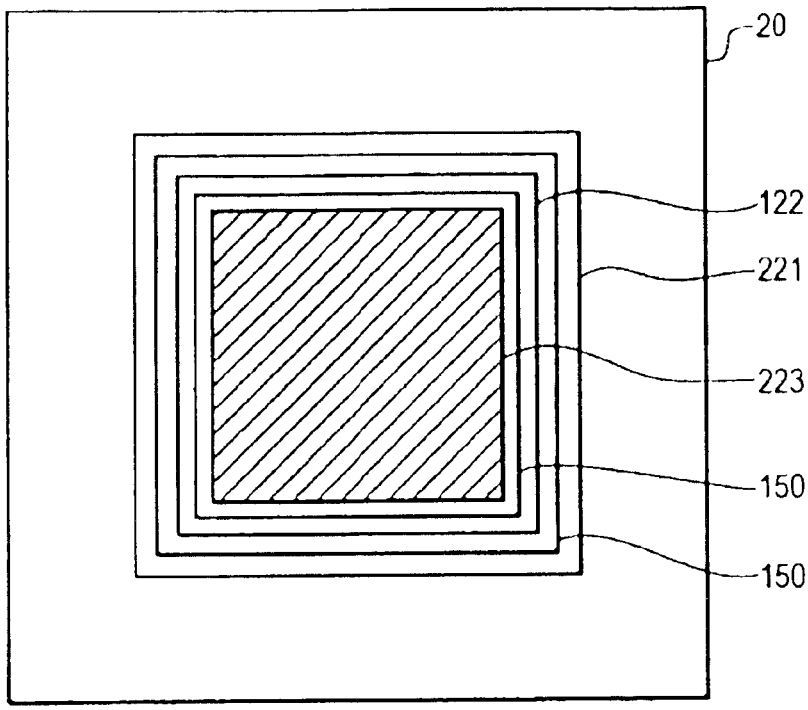
FIGS. 20A–20B illustrate a touch switch with an integrated electroluminescent light emitting device.
Figure 20B:
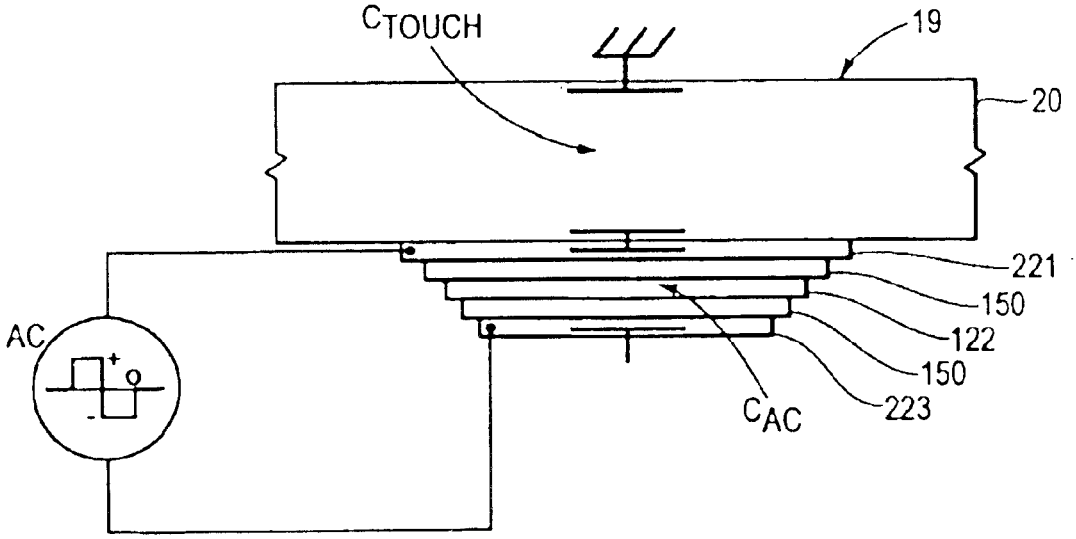

FIGS. 20A and 20B depict a touch switch having an electroluminescent device borne on substrate 20 including electrodes 221 and 223 separated from electroluminescent layer 122 by insulating layers 150. In FIG. 20B, an alternating current source AC is coupled to electrodes 221 and 223. Electrode 221 is preferably either transparent or translucent to allow light from the electroluminescent device to reach surface 19 of substrate 20. The lighting operation of the electroluminescent device will be understood by those skilled in the art of electroluminescent devices. Also shown schematically in FIG. 20B are capacitances $C_{touch}$ and $C_{AC}$, which represent the capacitance across substrate 20 and across the electroluminescent device including insulating layers 150 and electroluminescent layer 122, respectively.

Figure 21A:
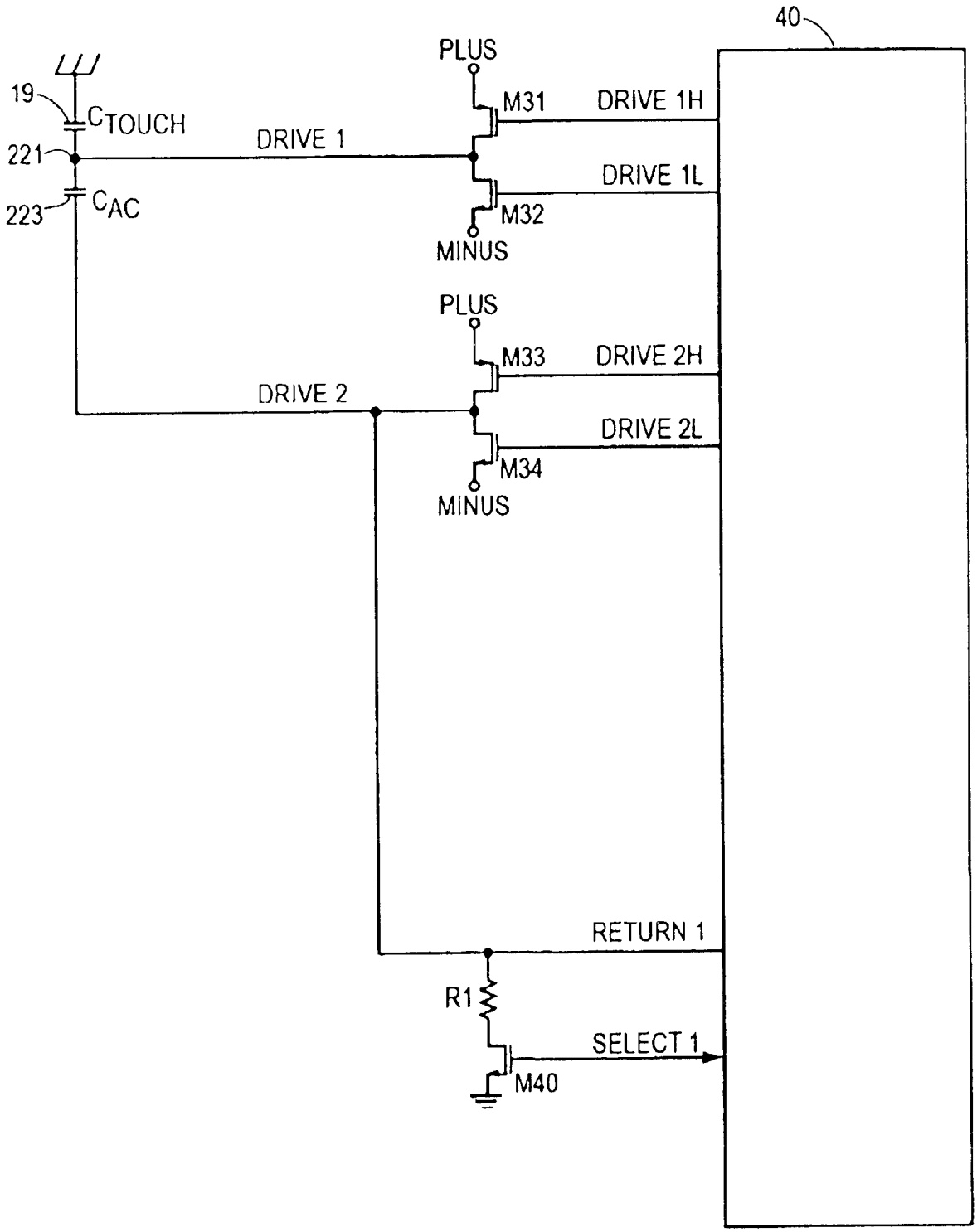
FIG. 21A illustrates a possible configuration of the input and output lines of a logic circuit for a touch switch and integrated electroluminescent device depicted in FIGS. 20A–20B.
Figure 21B:
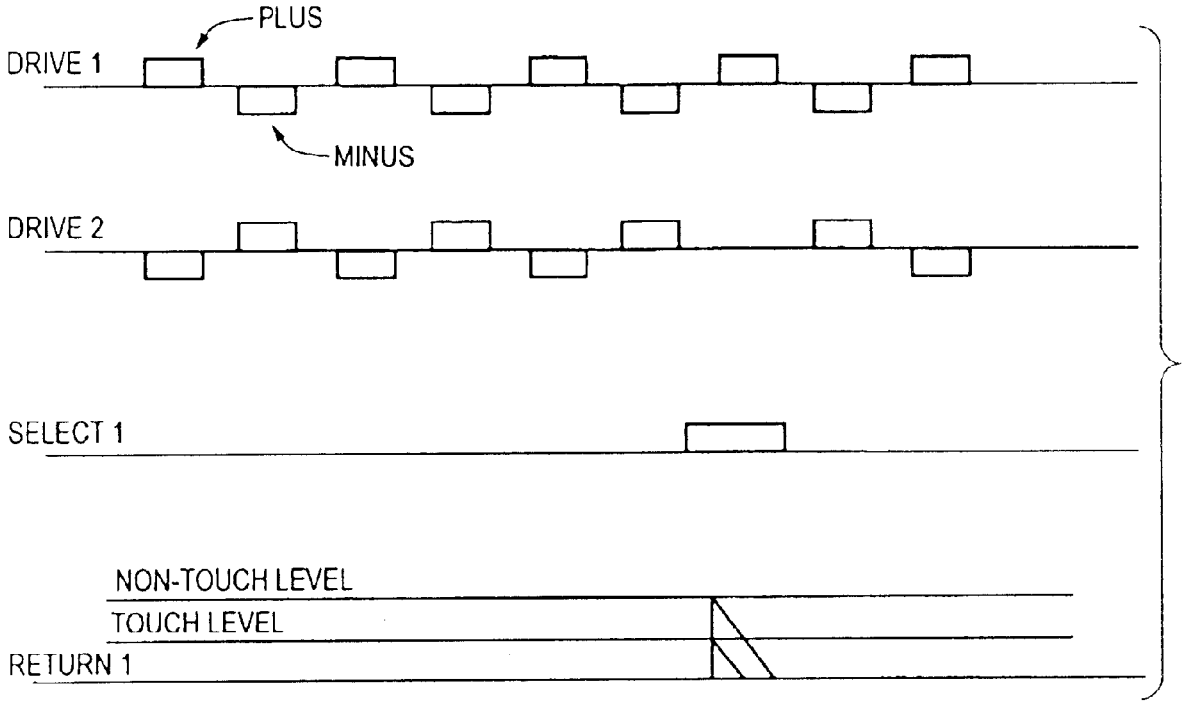
FIG. 21B illustrates a timing diagram for the configuration in FIG. 21A.

FIG. 21A illustrates a possible configuration of inputs to and outputs from a logic circuit 40 for the touch switch with integrated electroluminescent device of FIGS. 20A–20B. In FIG. 21A, surface 19 and electrodes 221 and 223 form capacitances $C_{touch}$ and $C_{AC}$, as also shown in FIG. 20B. Electrode 221 is coupled through trace DRIVE 2 to the drains of active devices M33 and M34, the gates of which are coupled to outputs DRIVE 2H and DRIVE 2L, respectively, of logic circuit 40. Electrode 223 is coupled through outputs DRIVE 1 to the drains of active devices M31 and M32, the gates of which are coupled to outputs DRIVE 1H and DRIVE 1L, respectively, of logic and decision circuit 40. Electrode 221 in also coupled to input RETURN 1 and to resistance R1, which is coupled to the drain of active device M40, the gate of which is coupled to output SELECT 1 of logic and decision circuit 40. FIG. 21B illustrates a timing diagram for the configuration in FIG. 21A. Electrodes 221 and 223 receive alternating current signals from signal source AC (shown in FIG. 20B), which, in FIG. 21A, can originate in logic and decision circuit 40 and is communicated on traces DRIVE 1H, DRIVE 1L, DRIVE 2H and DRIVE 2L. The operation of the buffering configurations of active devices M31 and M32 and active devices M33 and M34, will be understood to allow an alternating current to develop on traces DRIVE 1 and DRIVE 2 when appropriately signaled by logic and decision circuit 40. FIG. 21B shows how the signals on traces DRIVE 1 and DRIVE 2 are opposite one another such that when the signal on trace DRIVE 1 is high, the signal on trace DRIVE 2 is low, and vice versa.

The light emitting electroluminescent device depicted in FIG. 20B can function as a touch switch when configured and signaled as shown in FIGS. 21A–21B. Trace DRIVE 1 will be high when output DRIVE 1H is high, biasing on active device M31 and allowing voltage PLUS to appear on trace DRIVE 1. When output SELECT 1 of logic and decision circuit 40 is high, as shown in FIG. 21B, active device M40 will allow current to pass through resistance R1 such that a voltage will develop on input RETURN 1. Also, when output SELECT 1 is high, the no signal appears on trace DRIVE 2. The voltage appearing on input RETURN 1 will be one value when no stimulus appears at surface 19 and a lower value when a stimulus does appear at surface 19. Specifically, a stimulus at surface 19 will increase the effective capacitance $C_{touch}$ and shunt to ground current that would otherwise develop a high voltage across resistance R1. This increased effective capacitance and shunting to ground will correspond to a smaller voltage associated with the stimulated state on trace DRIVE 2 and input RETURN 1 than would develop if there were no stimulus and no increased capacitance. This is shown in FIG. 21B. The configuration of FIG. 21A and the timing shown in FIG. 21B are illustrative only. Other configurations and other timing patterns, using either the configuration of FIG. 21A or another configuration, are possible as well, and will be understood by those skilled in the art of circuit design.

Figure 22A:
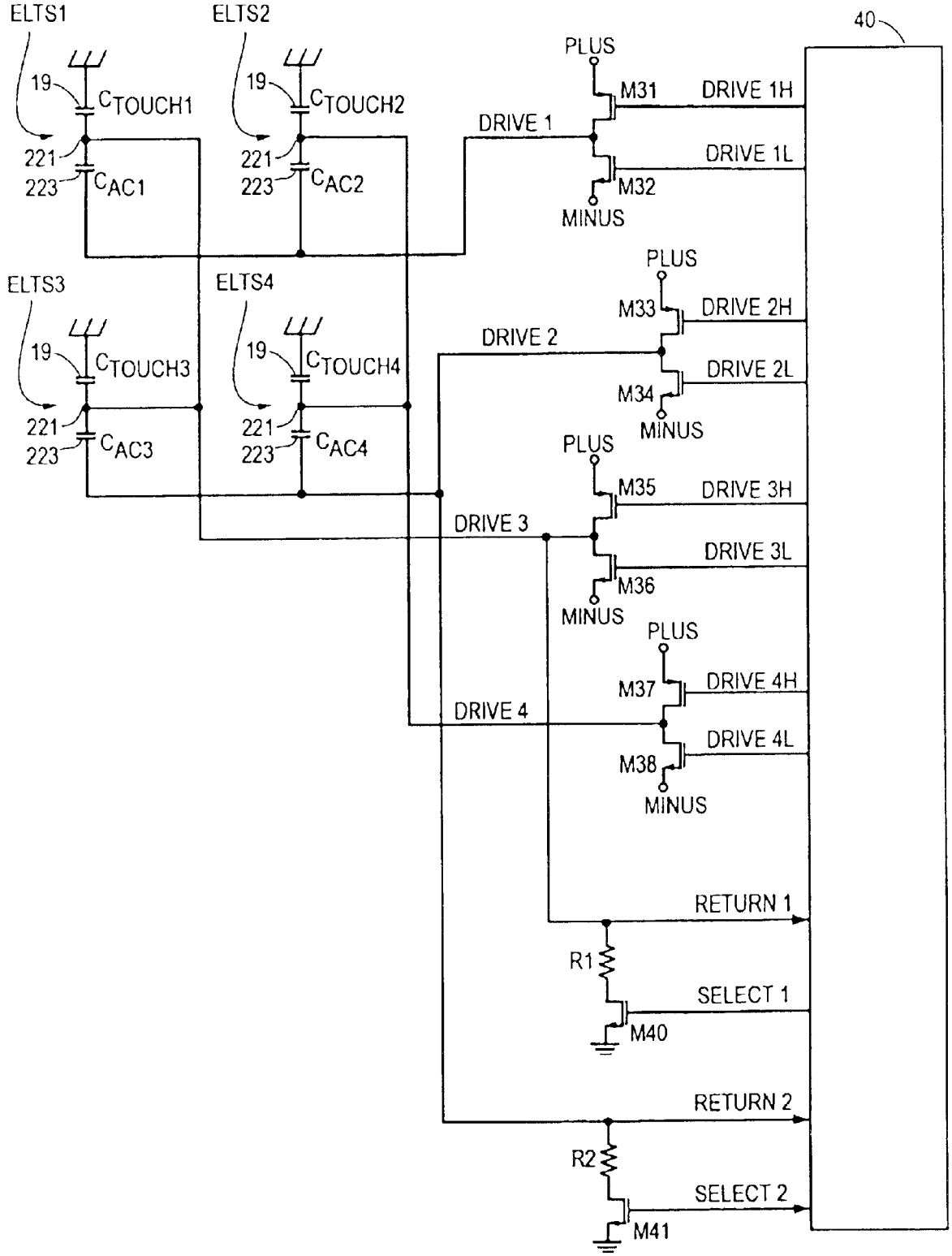
FIG. 22A illustrates a possible configuration of the input and output lines of a logic circuit for a two-by-two matrix of touch switches and integrated electroluminescent devices depicted in FIGS. 20A–20B.
Figure 22B:
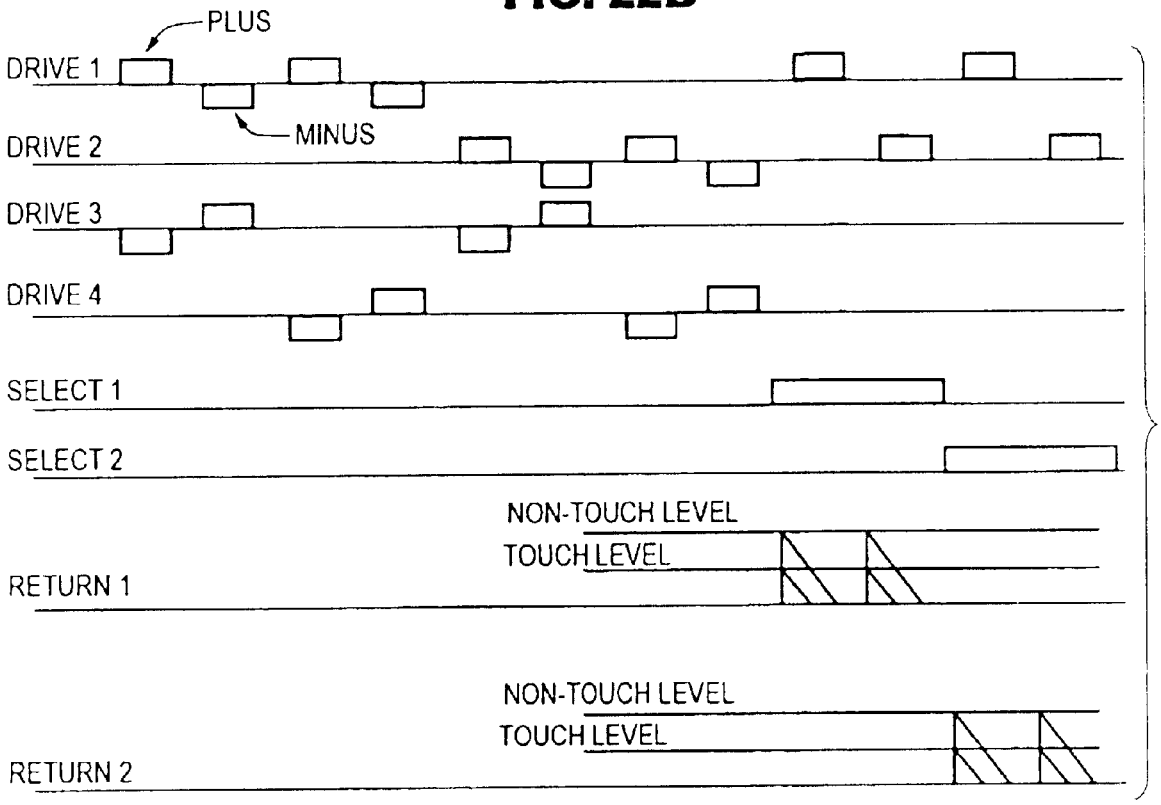
FIG. 22B illustrates a timing diagram for the configuration in FIG. 22A.

FIG. 22A illustrates a possible configuration of the input lines of a logic circuit for a two-by-two matrix of electroluminescent light emitting touch switches. In FIG. 22A, four electroluminescent touch switches ELTS1–ELTS4 are arranged in a two-by-two matrix and coupled through buffering devices including active devices M31–M38 to logic and decision circuit 40. Each electroluminescent touch switch operates in a manner similar to the manner described with reference to FIGS. 21A and 21B. FIG. 22B illustrates a timing diagram for the configuration in FIG. 22A. The configuration in FIG. 22A and the timing diagram of FIG. 22B illustrate how either one of two electroluminescent touch switches ELTS1–ELTS4 in a two touch switch column can create a signal on an input line RETURN 1 or RETURN 2 associated with a stimulated state of the column. For instance, either touch switch ELTS2 or ELTS4 can be stimulated, shunt current and reduce the voltage on input RETURN 2, coupled to resistance R2 coupled to the drain of active device M41, when output SELECT 2 is high, as shown in FIG. 22B. For a stimulus to touch switch ELTS2 to create a reduced voltage on input RETURN 2, trace DRIVE 1 must be high and creating a potential on electrode 223 of touch switch ELTS2. For a stimulus to touch switch ELTS4 to create such a reduced voltage on input RETURN 1, trace DRIVE 2 must be high. As discussed above, other configuration or timing schemes are possible as well, as will be understood from the foregoing description.

Figure 23:
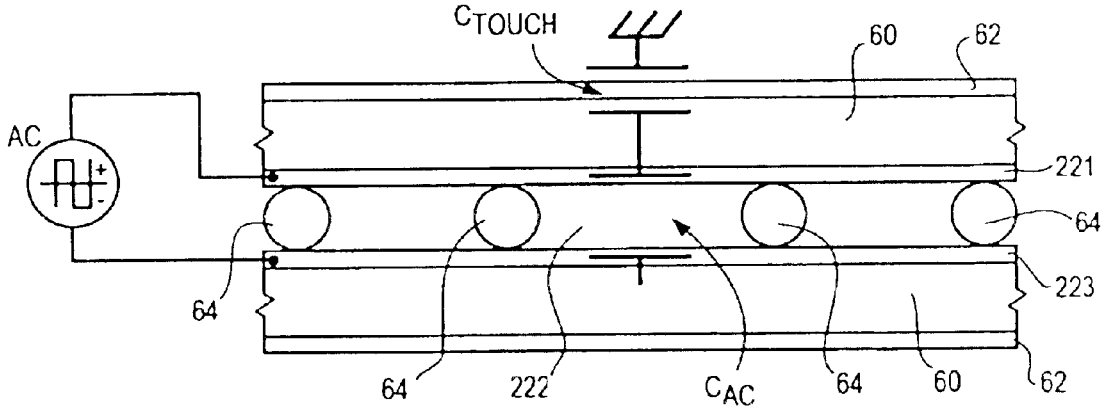
FIG. 23 illustrates a touch switch with a liquid crystal integrated light emitting device.

FIG. 23 illustrates a touch switch with a liquid crystal integrated light emitting device that can replace the electroluminescent touch switches in the schematics of FIGS. 21A and 22A. In FIG. 23 alternating signal source AC is coupled to electrodes 221 and 223, which are on either side of liquid crystal layer 222 and are supported by spacers 64.

Glass layer 60 and polarizer layer 62 are, in turn, on the outermost side of electrodes 221 and 223. Electrodes 221 and 223 form capacitance $C_{AC}$ and topmost glass and polarizer layers 60 and 62 form capacitance $C_{touch}$. The light emitting operation of the liquid crystal light emitting device of FIG. 23 will be understood by those skilled in the art and the touch switch operation will be understood from the foregoing description of FIGS. 21A–22B.

Although some embodiments of the present invention have been described and illustrated using only one specific type of touch sensor, e.g., a touch sensor with integrated control circuit, it will be understood that any embodiment of the present invention can be used in conjunction with any type of touch switch. Moreover, the various aspects of the present invention described above can be combined in any way according to the requirements of the application for which the touch sensor is intended. The invention may also be embodied in other forms not explicitly depicted in a drawing without departing from its spirit or essential character. The described embodiments are to be considered in all respects only as illustrative and not restrictive. The scope of the invention is indicated by the appended claims rather than by the foregoing description. All changes which come within the meaning and range of equivalency of the claims therefore are to be embraced within that scope.

What is claimed is:

1. A selectively illuminated touch sensor apparatus, comprising:

a substrate;

a first touch sensor disposed on said substrate;

a first insulating layer, wherein at least a portion of said first insulating layer is disposed on said first touch sensor; and a first independent light emitting device, wherein at least a portion of said first independent light emitting device is disposed on said first insulating layer in alignment with said first touch sensor.

2. The apparatus as claimed in claim 1, wherein at least a portion of said substrate is translucent.

3. The apparatus as claimed in claim 1, wherein at least a portion of said substrate is transparent.

4. The apparatus as claimed in claim 1, wherein at least a portion of said insulating layer is translucent.

5. The apparatus as claimed in claim 1, wherein at least a portion of said insulating layer is transparent.

6. The apparatus as claimed in claim 1, wherein said substrate is substantially rigid.

7. The apparatus as claimed in claim 1, wherein said substrate is substantially flexible.

8. The apparatus as claimed in claim 1, wherein said first touch sensor comprises a first electrode disposed on said substrate and at least a portion of said first independent light emitting device overlies at least a portion of said first electrode.

9. The apparatus as claimed in claim 8, wherein at least a portion of said first electrode is translucent.

10. The apparatus as claimed in claim 8, wherein at least a portion of said first electrode is transparent.

11. The apparatus as claimed in claim 8, further comprising an integrated control circuit disposed on said substrate and electrically coupled to said first electrode.

12. The apparatus as claimed in claim 11, wherein said integrated control circuit includes a peak detector.

13. The apparatus as claimed in claim 11, wherein said integrated control circuit includes a latch.

14. The apparatus as claimed in claim 8, wherein said first touch sensor comprises a second electrode, said second electrode disposed on said substrate in a spaced, coplanar and substantially surrounding relationship to said first electrode.

15. The apparatus as claimed in claim 14, further comprising an active device disposed on said substrate and electrically coupled to said first electrode and said second electrode.

16. The apparatus as claimed in claim 15, wherein said active device is a transistor.

17. The apparatus as claimed in claim 14, further comprising an integrated control circuit disposed on said substrate and electrically coupled to said first electrode and said second electrode.

18. The apparatus as claimed in claim 17, wherein said integrated control circuit includes a peak detector.

19. The apparatus as claimed in claim 17, wherein said integrated control circuit includes a latch.

20. The apparatus as claimed in claim 1, where said touch sensor is selected from the group consisting of a capacitive touch sensor, an electric field touch sensor, an infrared touch sensor, an acoustic touch sensor and an electromagnetic touch sensor.

21. The apparatus as claimed in claim 1, where said light emitting device is selected from the group consisting of a light emitting diode, a light emitting polymer, an organic light emitting diode, and a polymer light emitting diode.

22. The apparatus as claimed in claim 1, further comprising means for controlling the activation of and detecting the stimulation status of said first touch sensor and for controlling the illumination of said first independent light emitting device.

23. The apparatus as claimed in claim 1, further comprising a drive circuit controlling the activation of and detecting the stimulation status of said first touch sensor and controlling the illumination of said first independent light emitting device, said drive circuit coupled to said first touch sensor and to said first independent light emitting device.

24. The apparatus as claimed in claim 23 wherein said drive circuit is adapted to selectively illuminate said first independent light emitting device as a function of the activation and/or stimulation status of said first touch sensor.

25. The apparatus as claimed in claim 1, further comprising:

a second touch sensor disposed on said substrate;

a second insulating layer, wherein at least a portion of said second insulating layer is further disposed on said second touch sensor; and a second independent light emitting device, wherein at least a portion of said second independent light emitting device is disposed on said second insulating layer in alignment with said second touch sensor.

26. The apparatus as claimed in claim 25, further comprising means for controlling the activation of and detecting the stimulation status of said first touch sensor and said second touch sensor and for controlling the illumination of said first independent light emitting device and said second independent light emitting device.

27. The apparatus as claimed in claim 25, further comprising a drive circuit controlling the activation of and detecting the stimulation status of said first touch sensor and said second touch sensor and controlling the illumination of said first independent light emitting device and said second independent light emitting device, said drive circuit coupled to said first touch sensor, said second touch sensor, said first independent light emitting device, and said second independent light emitting device.

28. The apparatus as claimed in claim 27 wherein said drive circuit is adapted to selectively illuminate said first independent light emitting device as a function of the activation status of said first touch sensor and to selectively illuminate said second independent light emitting device as a function of the activation and/or stimulation status of said second touch sensor.

29. The apparatus as claimed in claim 25, further comprising:

a third touch sensor disposed on said substrate;

a third insulating layer, wherein at least a portion of said third insulating layer is further disposed on said third touch sensor; and a third independent light emitting device, wherein at least a portion of said third independent light emitting device is disposed on said third insulating layer in alignment with said third touch sensor.

30. The apparatus as claimed in claim 29, further comprising means for controlling the activation of and detecting the stimulation status of said first touch sensor, said second touch sensor, and said third touch sensor and controlling the illumination of said first independent light emitting device, said second independent light emitting device, and said third independent light emitting device.

31. The apparatus as claimed in claim 29, further comprising a drive circuit controlling the activation of and detecting the stimulation status of said first touch sensor, said second touch sensor, and said third touch sensor and controlling the illumination of said first independent light emitting device, said second independent light emitting device, and said third independent light emitting device.

32. The apparatus as claimed in claim 31 wherein said drive circuit is adapted to selectively illuminate said first independent light emitting device as a function of the activation and/or stimulation status of said first touch sensor, to selectively illuminate said second independent light emitting device as a function of the activation and/or stimulation status of said second touch sensor, and to selectively illuminate said third independent light emitting device as a function of the activation and/or stimulation status of said third touch sensor.

* * * * *